(12) United States Patent
Denda et al.

(10) Patent No.: US 9,603,253 B2
(45) Date of Patent: Mar. 21, 2017

(54) WIRING SUBSTRATE, MANUFACTURING METHOD THEREFOR, AND SEMICONDUCTOR PACKAGE

(71) Applicant: SHINKO ELECTRIC INDUSTRIES CO., LTD., Nagano (JP)

(72) Inventors: Tatsuaki Denda, Nagano (JP); Toshio Kobayashi, Nagano (JP); Yasuyoshi Horikawa, Nagano (JP); Hiroshi Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 21 days.

(21) Appl. No.: 14/591,239

(22) Filed: Jan. 7, 2015

(65) Prior Publication Data

US 2015/0201485 A1    Jul. 16, 2015

(30) Foreign Application Priority Data

Jan. 14, 2014 (JP) .................................. 2014-004629
Nov. 10, 2014 (JP) .................................. 2014-228199

(51) Int. Cl.
*H05K 1/18* (2006.01)
*H05K 1/02* (2006.01)

(52) U.S. Cl.
CPC ........... *H05K 1/181* (2013.01); *H05K 1/0206* (2013.01); *H01L 2224/16225* (2013.01); *H01L 2224/48091* (2013.01); *H01L 2224/48137* (2013.01); *H01L 2224/48227* (2013.01); *H01L 2224/73265* (2013.01); *H05K 2201/0154* (2013.01); *H05K 2201/066* (2013.01); *H05K 2201/10106* (2013.01); *H05K 2201/2054* (2013.01); *Y02P 70/611* (2015.11); *Y10T 156/1064* (2015.01)

(58) Field of Classification Search
CPC .... H05K 1/0203; H05K 1/181; H05K 1/0298; H05K 3/0058; H05K 3/02; H05K 1/18
USPC .......................................... 257/692; 361/709
See application file for complete search history.

(56) References Cited

U.S. PATENT DOCUMENTS

| | | | | |
|---|---|---|---|---|
| 4,396,936 A | * | 8/1983 | McIver | ............... H01L 23/3736 174/252 |
| 5,808,872 A | * | 9/1998 | Ozawa | ................ H01L 23/3121 257/684 |
| 5,923,084 A | * | 7/1999 | Inoue | .................. H01L 23/3121 257/712 |

(Continued)

FOREIGN PATENT DOCUMENTS

JP      2013-065621      4/2013

*Primary Examiner* — Michael F McAllister
(74) *Attorney, Agent, or Firm* — IPUSA, PLLC

(57) ABSTRACT

A wiring substrate includes a heat radiation plate and a substrate provided on the heat radiation plate interposed by an adhesive layer. The substrate includes a first surface on which the adhesive layer is provided and a second surface on an opposite side of the first surface. The wiring substrate also includes a wiring provided on the second surface of the substrate, and a notch part that penetrates the substrate in a thickness direction of the substrate, with the notch part being formed by notching the wiring substrate inward from an outer edge part of the substrate from a plan view. The adhesive layer covers an end surface of the substrate that is exposed in an inner wall surface of the notch part.

14 Claims, 20 Drawing Sheets

(56) References Cited

U.S. PATENT DOCUMENTS

| | | | | |
|---|---|---|---|---|
| 6,064,114 A | * | 5/2000 | Higgins, III | H01L 23/3114 257/698 |
| 6,920,046 B2 | * | 7/2005 | Spryshak | H05K 1/0206 165/185 |
| 7,148,554 B2 | * | 12/2006 | Nah | H05K 1/0206 257/528 |
| 7,550,319 B2 | * | 6/2009 | Wang | C03C 8/02 257/432 |
| 2007/0057364 A1 | * | 3/2007 | Wang | C03C 8/02 257/701 |
| 2010/0033976 A1 | * | 2/2010 | Sun | H05K 1/0206 362/382 |
| 2013/0279118 A1 | * | 10/2013 | Koyama | C09J 9/00 361/709 |

* cited by examiner

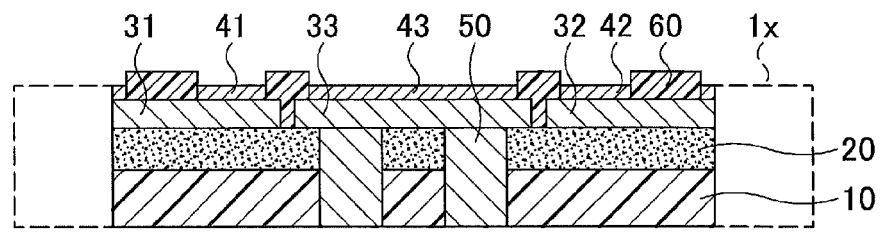
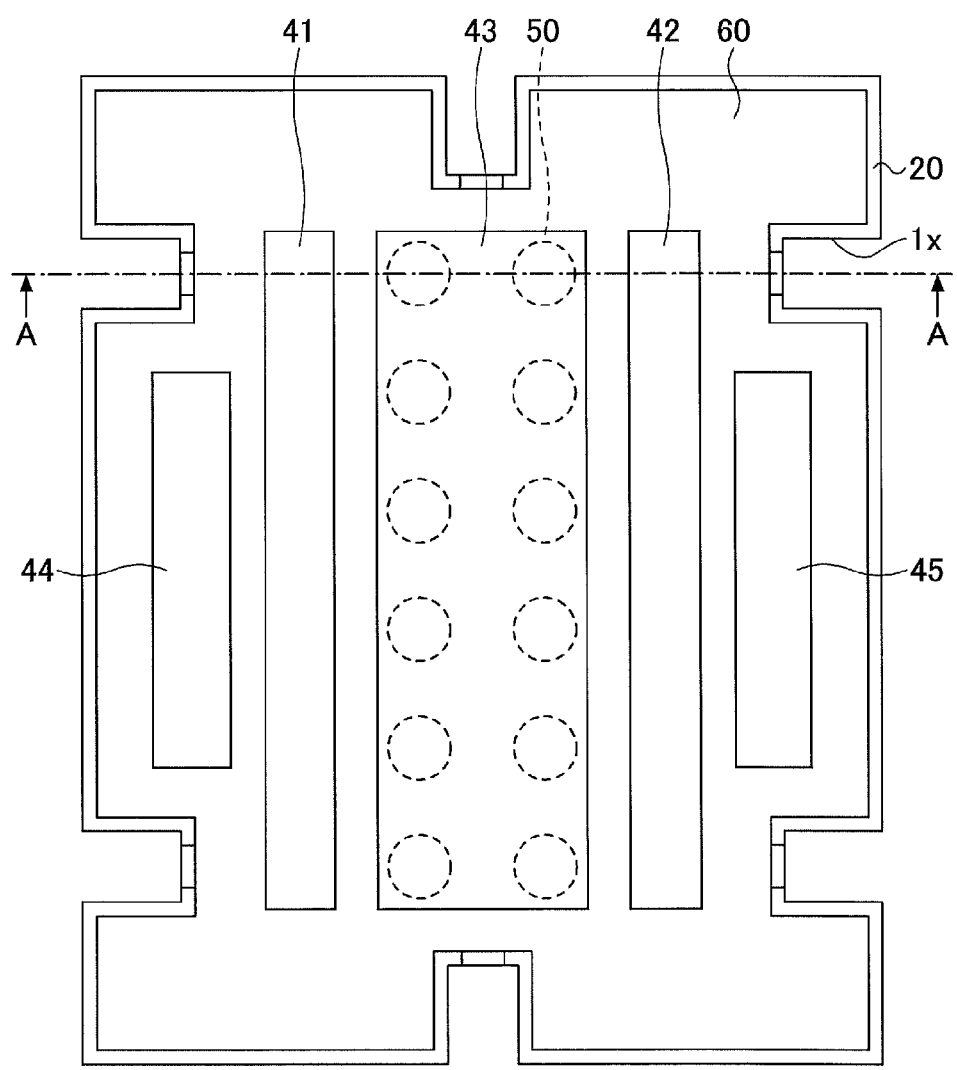

WIRING SUBSTRATE, MANUFACTURING METHOD THEREFOR, AND SEMICONDUCTOR PACKAGE

CROSS-REFERENCE TO RELATED APPLICATIONS

This application is based upon and claims the benefit of priority of the prior Japanese Patent Application Nos. 2014-004629 and 2014-228199 filed on Jan. 14, 2014 and Nov. 10, 2014, the entire contents of which are incorporated herein by reference.

FIELD

The embodiments discussed herein are related to a wiring substrate, a method for manufacturing the wiring substrate, and a semiconductor package.

BACKGROUND

In recent years, there is proposed a wiring substrate for mounting a light emitting device thereon. For example, the wiring substrate may include a wiring part having a wiring that is patterned on a substrate and an insulating layer that selectively exposes the wiring. In the wiring substrate, the wiring that is exposed from the insulating layer is used as a terminal that is electrically connected to a semiconductor device (see, for example, Japanese Laid-Open Patent Publication No. 2013-65621).

Because the semiconductor device such as a light emitting device generates heat during operation, the temperature of the semiconductor device may need to be prevented from surpassing a predetermined temperature. Therefore, in some cases, the wiring substrate may have a heat radiation plate provided on the wiring part interposed by an adhesive layer. However, because the adhesive layer is adhered only to a lower surface of the substrate of the wiring part (the surface on the side of the heat radiation plate), the adhesive layer may be heated to a high temperature due to the heat generated by the semiconductor device. Further, adhesive strength between the heat radiation plate and the wiring part may be degraded in a case where the semiconductor device is repeatedly stored in a low temperature environment when the semiconductor device is not operating.

SUMMARY

According to an aspect of the invention, there is provided a wiring substrate that includes a heat radiation plate, and a substrate provided on the heat radiation plate interposed by an adhesive layer. The substrate includes a first surface on which the adhesive layer is provided and a second surface on an opposite side of the first surface. The wiring substrate also includes a wiring provided on the second surface of the substrate, and a notch part that penetrates the substrate in a thickness direction of the substrate, with the notch part being formed by notching the wiring substrate inward from an outer edge part of the substrate from a plan view. The adhesive layer covers an end surface of the substrate that is exposed in an inner wall surface of the notch part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B are schematic diagrams illustrating a step for manufacturing a light emitting device mounting package of the first embodiment (part 5);

DESCRIPTION OF EMBODIMENTS

Figure 1A:
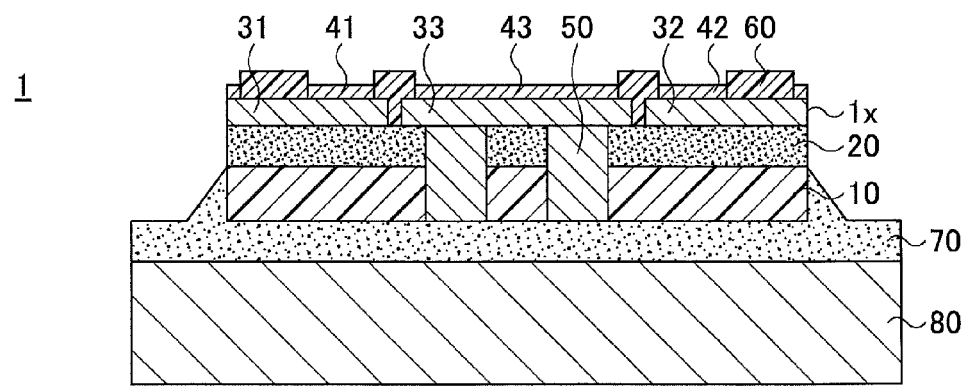
FIGS. 1A and 1B are schematic diagrams illustrating a wiring substrate according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of the Wiring Substrate of the First Embodiment

First, a structure of a wiring substrate 1 according to a first embodiment of the present invention is described. FIG. 1B is a plan view of the wiring substrate 1, and FIG. 1A is a cross-sectional view taken along the line A-A of FIG. 1B.

Figure 1B:
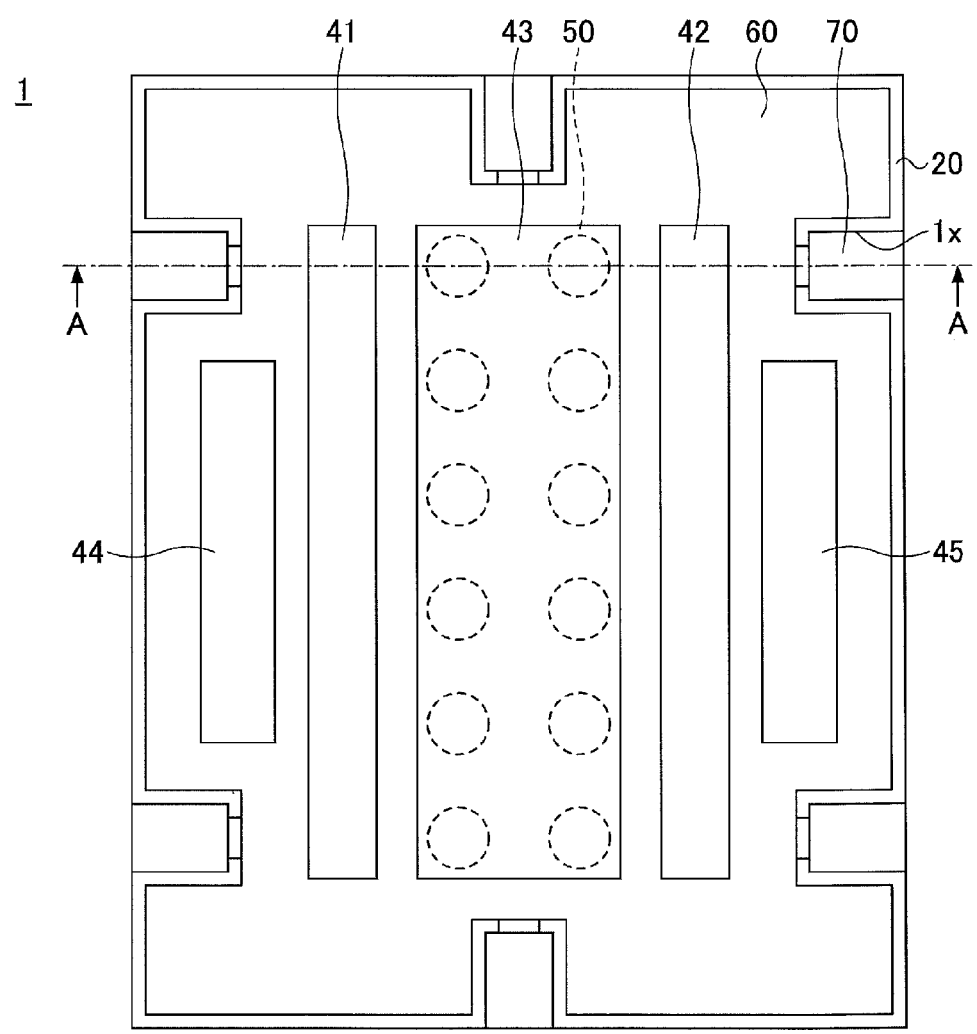

With reference to FIGS. 1A and 1B, the wiring substrate 1 includes, for example, a substrate 10, an adhesive layer 20, wirings 31-33, plating films 41-45, a through-wiring 50, an insulating layer 60, an adhesive layer 70, and a heat radiation plate 80. The substrate 10, the adhesive layer 20, the wirings 31-33, the plating films 41-45, and the through-wiring 50 may also be referred to as a wiring part of the wiring substrate 1. That is, the wiring substrate 1 has a structure in which the wiring part is provided on the heat radiation plate 80 interposed by the adhesive layer 70. However, the adhesive layer 20 is an additional element of the wiring substrate 1 and is not a requisite element of the wiring substrate 1.

In this embodiment, for the sake of convenience, the side positioned toward the insulating layer 60 of the wiring substrate 1 (upper side of FIG. 1A) may be described as "one side" or an "upper side" whereas the side positioned toward the heat radiation plate 80 of the wiring substrate 1 (lower side of FIG. 1A) may be described as the "other side", "another side" or a "lower side". Further, a surface of each part (element) positioned toward a side of the insulating layer 60 may be described as "one surface" or an "upper surface" whereas a surface of each part (element) positioned toward the heat radiation plate 80 may be described as the "other surface", "another surface" or a "lower surface". However, the wiring substrate 1 may be used in an upside down state or positioned at a given angle. Further, a "plan view" refers to observing an object from a direction of a line normal to one surface of the substrate 10. Further, a "plan-view shape" of an object refers to a shape of the object observed from a direction of a line normal to one surface of the substrate 10.

For example, an insulating resin film having an elastic property may be used as the substrate 10 of the coil substrate 1. For example, a polyimide type resin film (e.g., polyimide tape), an epoxy type resin film, or a polyester type resin film may be used as the insulating resin film. However, the substrate 10 is not limited to an insulating resin film having an elastic property. For example, a grade FR4 (Flame Retardant 4) glass epoxy resin may be used as the substrate 10. The thickness of the substrate 10 may be, for example, approximately 25 μm to 75 μm.

The adhesive layer 20 is adhered to one surface of the substrate 10 and bonds the wirings 31-33 to the substrate 10. For example, a heat resistant adhesive agent formed of an insulating resin such as an epoxy type adhesive agent or a polyimide type adhesive agent may be used to form the adhesive layer 20. The thickness of the adhesive layer 20 may be, for example, approximately 5 μm to 15 μm.

The wirings 31-33 are provided on one surface of the substrate 10 interposed by the adhesive layer 20. The wirings 31-33 are electrically independent from each other. The wiring 31 and the wiring 32 are wirings that are to be connected to a terminal of a semiconductor device such as a light emitting device. The wiring 33 is used for heat radiation and does not contribute to the operation of the semiconductor device. The wiring 33 is connected to one end of the through-wiring 50 that penetrates the substrate 10 and the adhesive layer 20.

The configuration for mounting the wirings 31-33 on the semiconductor device is described below. Although different reference numerals are used to indicate the wirings 31-33, the wirings 31-33 may be formed in the same step and with the same material as described below. In a case where there is no need to differentiate the wirings 31-33, the wirings 31-33 may be collectively referred to as "wiring 30". For example, copper (Cu) may be used as the material of the wiring 30. The thickness of the wiring 30 may be, for example, approximately 12 μm to 35 μm.

The plating films 41-43 are provided on areas of the insulating layer 60 from which upper surfaces of the wirings 31-33 are exposed, respectively. Although not illustrated in the cross section of FIG. 1A, the wiring 31 includes an area that is to be used as one external connection terminal. A plating film 44 is provided in the area to be used as the one external connection terminal. That is, the plating film 41 and the plating film 44 are electrically connected to each other. Similarly, the wiring 32 includes an area that is to be used as another external connection terminal. A plating film 45 is provided in the area to be used as the other external connection terminal. That is, the plating film 42 and the plating film 45 are electrically connected to each other. The plating films 41-45 may have, for example, thin elongated shapes and aligned at predetermined intervals. Although different reference numerals are used to indicate the plating films 41-45, the plating films 41-45 may be formed in the same step and with the same material as described below. In a case where there is no need to differentiate the plating films 41-45, the plating films 41-45 may be collectively referred to as "plating film 40".

The plating film 40 may be, for example, a Ni/Au film including nickel (or a nickel alloy) and gold (or a gold alloy), a Ni/Pd/Au film including nickel (or a nickel alloy), palladium (or a palladium alloy), and gold (or a gold alloy), or a Ni/Pd/Ag/Au film including nickel (or a nickel alloy), palladium (or a palladium alloy), silver (or a silver alloy), and gold (or a gold alloy). Alternatively, the plating film 40 may be, for example, a Ag film including silver (or a silver alloy), a Ni/Ag film including nickel (or a nickel alloy) and silver (or a silver alloy), Ni/Pd/Ag film including nickel (or a nickel alloy), palladium (or a palladium alloy), and silver (or a silver alloy). It is to be noted that a "AA/BB film" indicates an AA film and a BB film layered on a target object in this order. The same applies to a layered structure formed of three or more layers of film.

Among the materials that form the plating film 40, the thickness of the Au film (or Au alloy film) and the Ag film (or Ag alloy film) is preferably 0.1 μm or more, respectively. Among the materials that form the plating film 40, the thickness of the Pd film (or Pd alloy film) is preferably 0.005 μm or more. Among the materials that form the plating film 40, the thickness of the Ni film (or Ni alloy film) is preferably 0.5 μm or more.

The through-wiring 50 is a wiring used for heat radiation and is also referred to as a "thermal via". In a case where a device that generates heat during an operation (e.g., light emitting device) is mounted on the wiring substrate 1, the through-wiring 50 is used as a part of a passage that allows the generated heat to escape to the side of the heat radiation plate 80. Multiple through-wirings 50 are provided on a surface of the wiring 33 toward the substrate 10. The through-wirings 50 fill corresponding through-holes that penetrate the substrate 10 and the adhesive layer 20. By providing multiple through-wirings 50 directly below the wiring 33 (12 through-wirings in the embodiment of FIG. 1B), heat radiation of the wiring substrate 1 can be improved.

The through-wiring 50 is integrally formed with the wiring 33. One end of the through-wiring 50 is connected to the wiring 33, and the other end of the through-wiring 50 is exposed from the other surface of the substrate 10. It is to be noted that the other end of the through-wiring 50 may project from the other surface of the substrate 10. The plan-view shape of the through-wiring 50 may be, for example, a circular shape. In this case, the diameter of the through-wiring 50 may be, for example, approximately 0.5 mm to 1 mm. However, the diameter of the through-wiring 50 may be greater than 1 mm in a case of, for example, improving heat radiation. Alternatively, the plan-view shape of the through-wiring 50 may be, for example, a rectangular shape or an elliptical shape. The thickness of the through-wiring 50 may be, approximately 25 μm to 75 μm. For example, copper (Cu) may be used as the material of the through-wiring 50.

In a case where the semiconductor device is a light emitting device, the insulating layer 60 is a reflection film provided on the substrate 10 to selectively expose the wiring 30, so that reflectivity of light and radiation efficiency of heat that are radiated from the light emitting device can be improved. As described above, the plating film 40 is provided on the wiring 30 exposed from the insulating layer 60. For example, the material of the insulating layer 60 may be a silicone type resin (e.g., epoxy type resin, organopolysiloxane) that includes a filler or pigment of titanium oxide ($TiO_2$) or barium sulfate ($BaSO_4$). Alternatively, the material of the insulating layer 60 may be a white ink that includes the above-described materials used for the insulating layer 60.

The insulating layer 60 is preferably provided to expose an outer edge part of the adhesive layer 20. Thus, in a case of simultaneously manufacturing the wiring substrates 1 on multiple areas and cutting (individualizing) the multiple areas, the insulating layer 60 can be prevented from being cut in the cutting process by providing the insulating layer 60 to expose the outer edge part of the adhesive layer 20. Thereby, the surroundings of the insulating layer 60 can be prevented from chipping or falling off. Accordingly, reduction of the surface area of the insulating layer 60 and degradation of reflectivity of the insulating layer 60 can be prevented.

The adhesive layer 70 is provided on the heat radiation plate 80. The adhesive layer 70 contacts the other surface of the substrate 10 to adhere (bond) the substrate 10 and the heat radiation plate 80 together. It is preferable to use a material having high heat conductivity because the adhesive layer 70 is used as a part of a passage that allows the heat transmitted from the through-wiring 50 to escape to the side of the heat radiation plate 80. For example, an adhesive agent formed of an insulating resin having a heat resistance property may be used as the adhesive layer (e.g., an epoxy type adhesive agent including a filler such as alumina or a polyimide type adhesive agent). The thickness of the adhesive layer 70 may be, for example, approximately 20 μm to 50 μm.

The heat radiation plate 80 is adhered to other surface of the substrate 10 by way of the adhesive layer 70. The heat radiation plate 80 may be a plate formed of metal material having high heat conductivity (e.g., copper (Cu), aluminum (Al)). Alternatively, the heat radiation plate 80 may be a plate formed of an insulating material having high heat conductivity (e.g., silicon or ceramics formed of alumina or aluminum nitride). The thickness of the heat radiation plate 80 may be, for example, approximately 100 μm to 500 μm. However, the thickness of the heat radiation plate 80 may be a few millimeters in a case where further heat radiation is desired.

The wiring substrate 1 includes a notch part 1x that penetrates the substrate 10 in the thickness direction of the wiring substrate 1. The notch part 1x is formed by notching (cutting) the wiring substrate 1 inward from an outer edge part of the substrate 10 from a plan view. Because the notch part 1x is formed by cutting portions of the substrate 10, the adhesive layer 20, the wiring 30, and the plating film 40, an end surface of each of the substrate 10, the adhesive layer 20, the wiring 30, and the plating film 40 is exposed from an inner wall surface of the notch part 1x. In this embodiment, the plan-view shape of the notch part 1x is a rectangular shape. However, the plan-view shape of the notch part 1x may be a semi-circular shape or a semi-elliptical shape.

Apart of the adhesive layer 70 enters the notch part 1x to cover at least a part of the inner wall surface of the notch part. FIG. 1A illustrates the adhesive layer 70 covering the end surface of the substrate 10 that is exposed in the inner wall surface of the notch part 1x. However, as illustrated in the below-described FIG. 7B, the adhesive layer 70 may continuously cover the end surface of the substrate 10, the end surface of the adhesive layer 20, and the end surface of the wiring 30 that are exposed in the inner wall surface of the notch part 1x. Alternatively, the adhesive layer 70 may be formed to continuously cover from the end surface of the substrate 10 to the end surface of the plating film 40. Alternatively, as illustrated in the below-described FIGS. 8A and 8B, the adhesive layer 70 may continuously cover the end surface of the substrate 10, the end surface of the adhesive layer 20, and the end surface of the wiring 30 and further extend above the wiring 30 (in this case, the upper surface of the plating film 40).

By covering at least a part of the inner wall surface of the notch part 1x with the adhesive layer 70, the bonding strength between the heating plate 80 and the wiring part of the wiring substrate 1 can be improved compared to a case where the bonding layer 70 is adhered only to the other surface of the substrate 10. Thereby, the heating plate 80 and the wiring substrate 1 can be prevented from separating from each other. This effect is particularly advantageous in a case where the wiring substrate 1 is repeatedly used in high and low temperature environments.

Figure 8A:
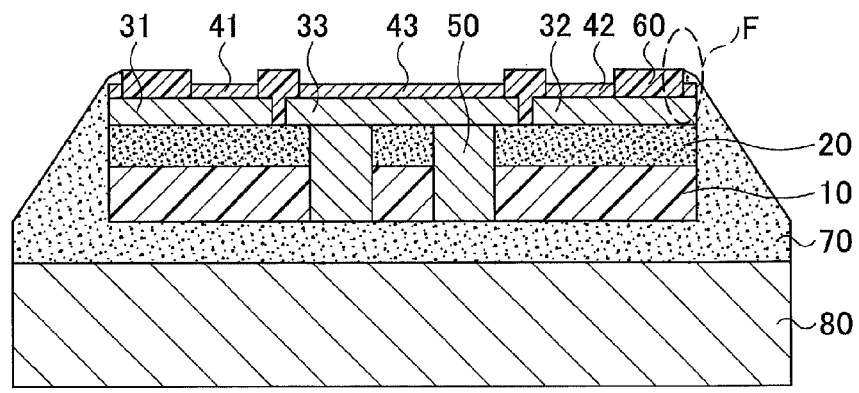
FIGS. 8A and 8B are schematic diagrams illustrating a step for manufacturing a light emitting device mounting package of the first embodiment (part 7)
Figure 8B:
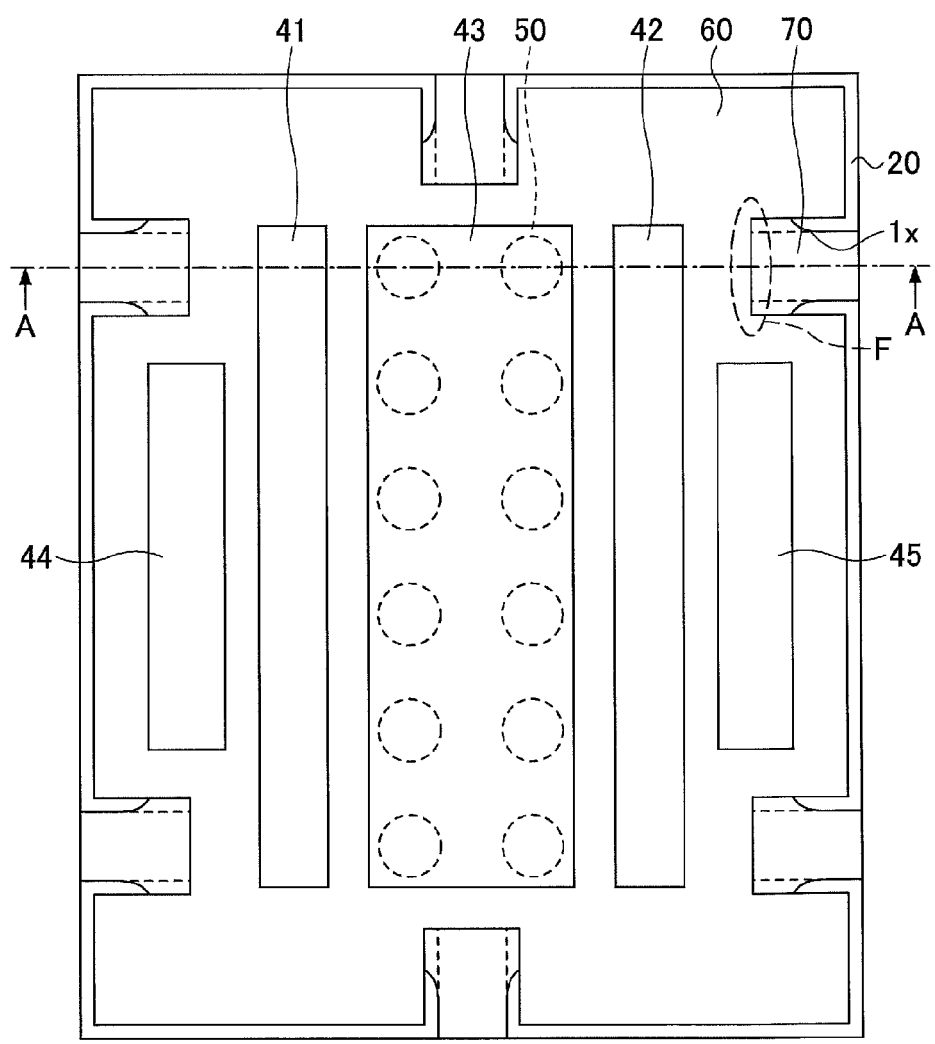

Particularly, in the embodiment illustrated in FIGS. 8A and 8B, the adhesive layer 70 continuously covers the end surface of the substrate 10, the end surface of the adhesive layer 20, and the end surface of the wiring 30 exposed in the inner wall surface of the notch part 1x and further extends to the upper surface of the plating film 40. That is, because the wiring 30 is formed in a C-like (square bracket-like) shape to cover apart of the end surface of the wiring part of the wiring substrate 1, the bonding strength between the heat radiation plate 80 and the wiring part of the wiring substrate 1 can be further improved. Thus, the heat radiation plate 80 and the wiring substrate 1 can be more effectively prevented from separating from each other.

Method for Manufacturing the Wiring Substrate of the First Embodiment

Next, a method for manufacturing a wiring substrate according to the first embodiment of the present invention is described. FIGS. 2A-8B are schematic diagrams illustrating processes for manufacturing the wiring substrate 1 according to the first embodiment. The following cross-sectional views used for describing the processes for manufacturing the wiring substrate 1 of the first embodiment (FIGS. 2A-2C, 3A, 4A, 5A, 6A, 7A, 7B, and 8A) correspond to the cross-sectional view of FIG. 1A.

Figure 2A:
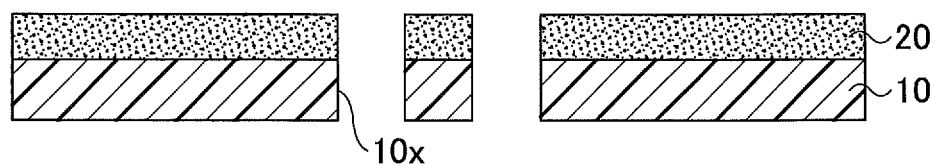
FIGS. 2A-2C are schematic diagrams illustrating steps for manufacturing a wiring substrate of the first embodiment (part 1)

First, in the process illustrated in FIG. 2A, the substrate 10 is prepared. The substrate 10 may be, for example, a tape-like polyimide film or a reel of the tape-like polyimide film. The adhesive layer 20 is formed by applying, for example, an epoxy type adhesive agent on one surface of the substrate 10. Instead of applying the epoxy type adhesive agent, an epoxy type adhesive film may be adhered on the one surface of the substrate 10. Then, a through-hole 10x is formed on one surface of the substrate 10 having the adhesive layer 20 formed thereon. The through-hole 10x penetrates the substrate 10 and the adhesive layer 20. The through-hole 10x is formed by, for example, a punching process. Although a structural body including for example, the substrate 10 has multiples areas in which wiring substrates 1 are to be formed, the processes of the manufacturing method are described by illustrating only one of the multiple areas in which the wiring substrates 1 are to be formed.

Figure 2B:
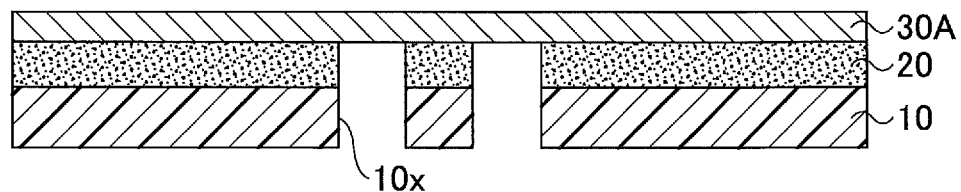

Then, in the process illustrated in FIG. 2B, the metal layer 30A is formed on the adhesive layer 20. The metal layer 30A is formed into the wiring layer 30 by performing the below-described patterning process on the metal layer 30A. Then, the adhesive layer 20 is cured by heating the adhesive layer 20 to a predetermined temperature. The metal layer 30A may be formed by, for example, laminating a copper foil on the adhesive layer 20. The thickness of the metal layer 30A may be, for example, approximately 18 μm to 35 μm. The structural body illustrated in FIG. 6A is impregnated in a solution used for wet-etching (e.g., hydrogen peroxide type solution) to etch upper and lower surfaces of the metal layer 30A exposed in the through-hole 10x (so-called soft etching process). By performing the etching process, an antirust agent can be removed from the surface of the metal layer 30A, and the thickness of the surface of the metal layer 30A can be slightly reduced (e.g., approximately 0.5 μm to 1 μm). However, the etching process is not a requisite. That is, the etching process may be performed according to necessity.

Figure 2C:
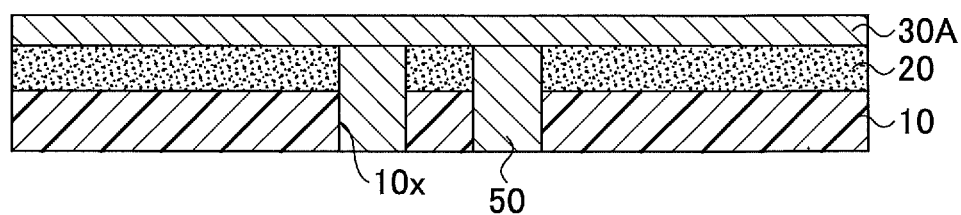

Then, in the process illustrated in FIG. 2C, the through-wiring 50 that is connected to the metal layer 30A is formed in the through-hole 10x. More specifically, a masking tape is adhered to the upper surface of the metal layer 30A. The masking tape is used to cover the upper surface of the metal layer 30A for preventing a plating film from growing on the upper surface side of the metal layer 30A when forming the through-wiring 50 with the below-described electroplating method.

Then, after adhering the masking tape, the through-wiring 50 is formed by the electroplating method using the metal layer 30A as a power-feeding layer. Then, the masking tape is removed. The through-wiring 50 is formed into a columnar shape by depositing a metal plating on the lower surface of the metal layer 30A exposed in the through-hole 10x and filling the inside of the through-hole 10x with the metal plating. The through-wiring 50 is formed, so that one end (the upper end in FIG. 2C) of the through-wiring 50 is electrically connected to the metal layer 30A whereas another end (the lower end in FIG. 2C) of the through-wiring 50 is exposed from the other surface of the substrate 10. For example, copper (Cu) may be used as the material of the through-wiring 50.

Figure 3A:
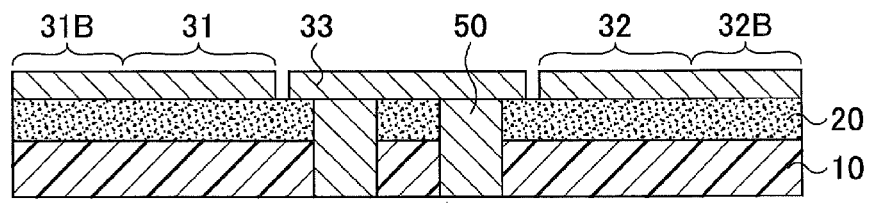
FIGS. 3A and 3B are schematic diagrams illustrating a step for manufacturing a wiring substrate of the first embodiment (part 2)
Figure 3B:
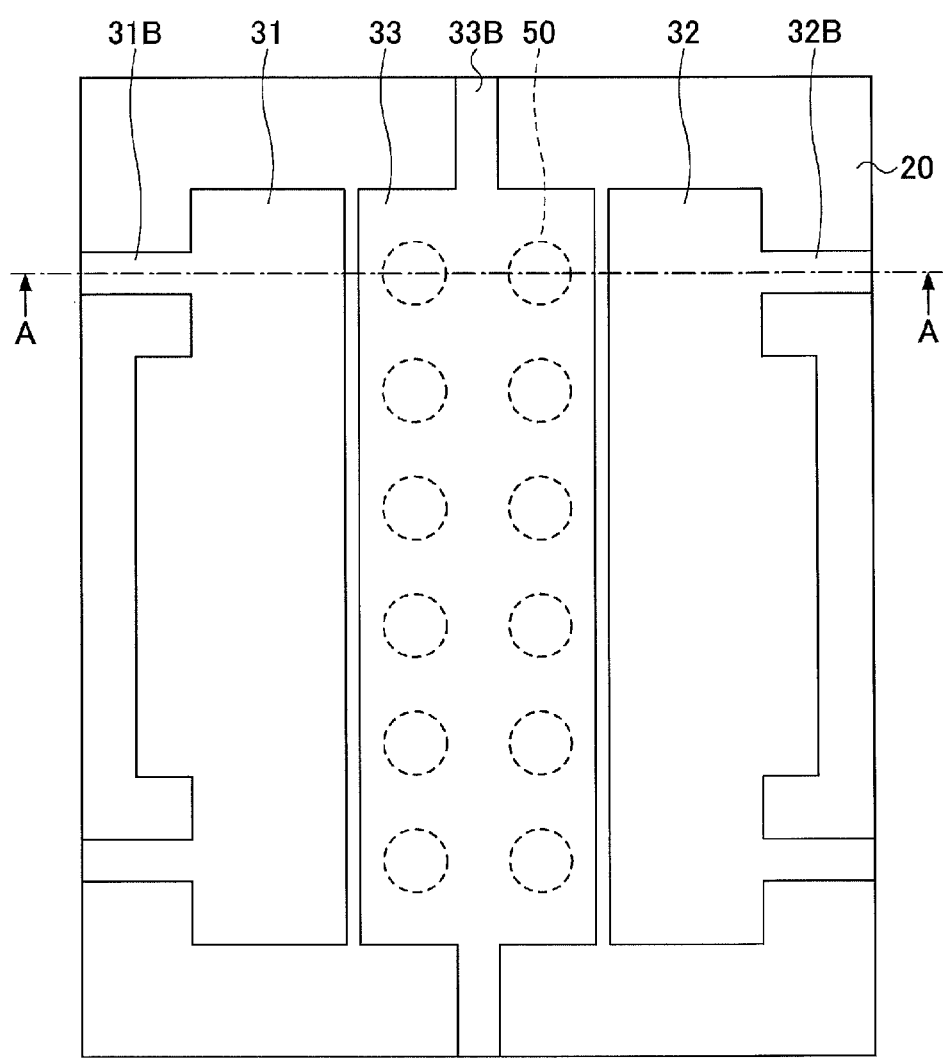

Then, in the process illustrated in FIGS. 3A and 3B (FIG. 3B is a plan view, and FIG. 3A is a cross-sectional view taken along the line A-A of FIG. 3B) the wirings 31-33 are formed by a performing a patterning process on the metal layer 30A. The bus-lines 31B-33B that are connected to the wirings 31-33 are formed at the same time as forming the wirings 31-33. The bus-lines 31B-33B are used in the below-described electroplating method for forming the plating film 40. More specifically, resist (not illustrated) is applied on the metal layer 30A and exposed to a light corresponding to the patterns of the wirings 31-33 and the patterns of the bus-lines 31B-33B. Thereby, patterns of the wirings 31-33 and the patterns of the bus lines 31B-33B are developed on the resist. Then, by etching the metal layer 30A by using the resist as a mask, the wirings 31-33 and the bus-lines 31B-33B having predetermined patterns are formed (patterning). Then, the resist is removed.

Figure 4A:
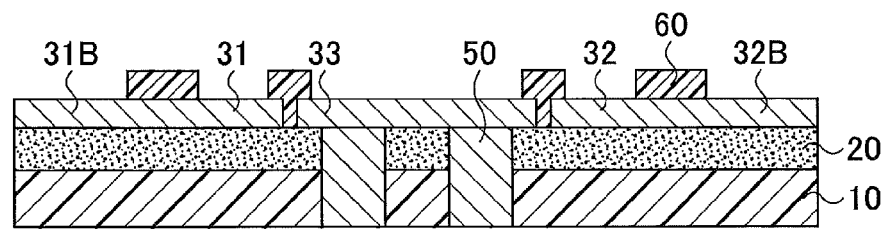
FIGS. 4A and 4B are schematic diagrams illustrating a step for manufacturing a light emitting device mounting package of the first embodiment (part 3)
Figure 4B:
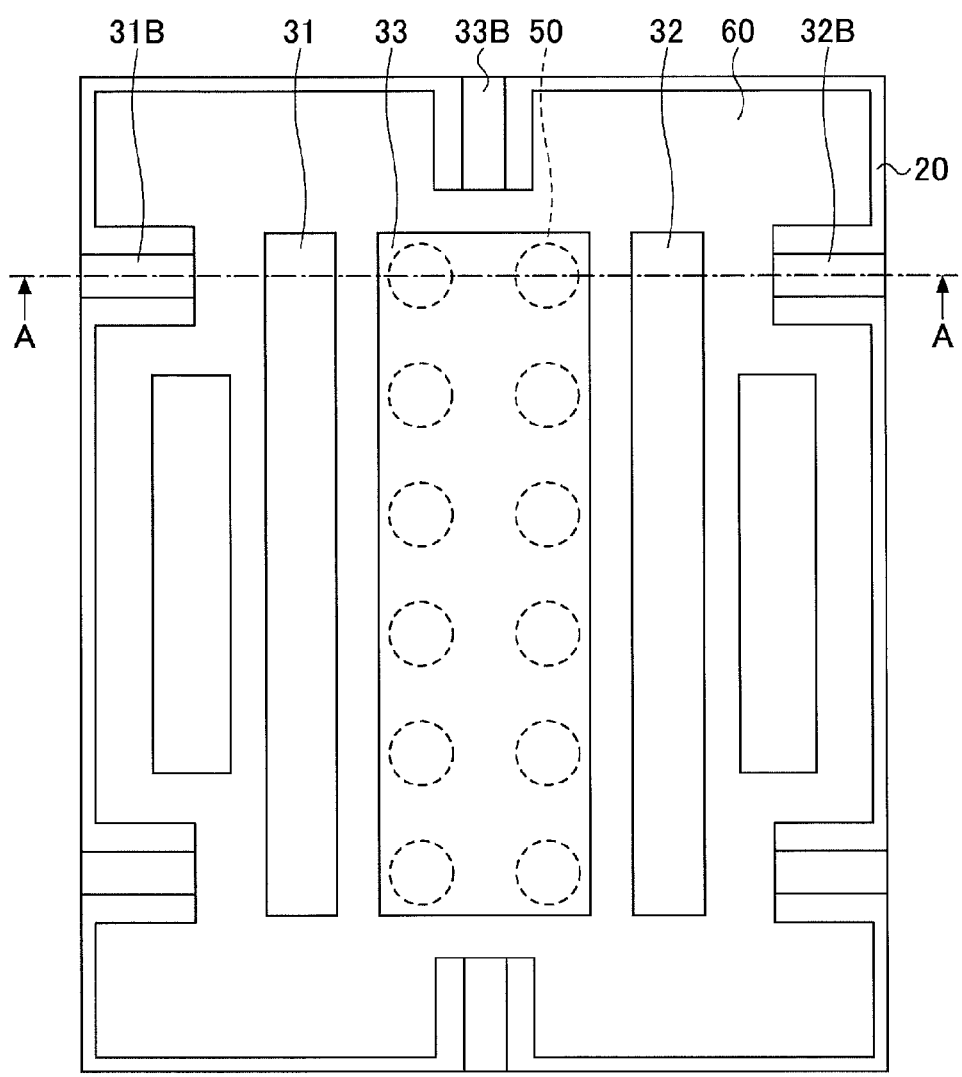

Then, in the process illustrated in FIGS. 4A and 4B (FIG. 4B is a plan view, and FIG. 4A is a cross-sectional view taken along the line A-A of FIG. 4B), the insulating layer 60 (reflection film) that selectively exposes the wiring 30 (i.e., exposing the part in which the plating films 41-45 is to be formed in a subsequent process) is formed. The material of the insulating layer 60 may be a white ink that includes the above-described materials used for the insulating layer 60. The insulating layer 60 may be formed by using, for example, a screen printing method. In forming the insulating layer 60, a blasting process or a laser process may be performed on the insulating layer 60 after a white ink or the like is formed to cover the entire wiring 30. Thereby, the parts of the wiring 30 on which the plating films 41-45 are to be formed become exposed from the insulating layer 60.

The insulating layer 60 is preferred to be formed to expose an outer edge part of each of the multiple areas in which the wiring substrate 1 is to be formed. By forming the insulating layer 60 to expose the outer edge part, a peripheral edge part of the insulating layer 60 can be prevented from chipping or falling off in a case of singulating (cutting) the multiple areas into individual areas. Thereby, a surface area of the insulating layer 60 can be prevented from being reduced, and reflectivity of the insulating layer 60 can be prevented from decreasing.

Further, the insulating layer 60 is preferred to be formed to expose a part in which the below-described notch part 1x is to be formed. Similarly, by forming the insulating layer 60 to expose the part in which the notch part 1x is formed, the peripheral edge part of the insulating layer 60 can be prevented from chipping or falling off in a case of singulating (cutting) the multiple areas into individual areas. Thereby, a surface area of the insulating layer 60 can be prevented from being reduced, and reflectivity of the insulating layer 60 can be prevented from decreasing.

Figure 5A:
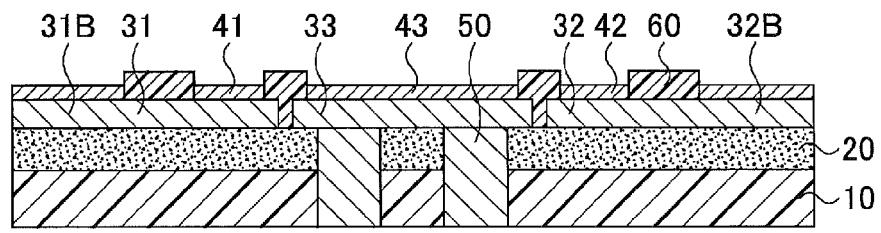
FIGS. 5A and 5B are schematic diagrams illustrating a step for manufacturing a light emitting device mounting package of the first embodiment (part 4)
Figure 5B:
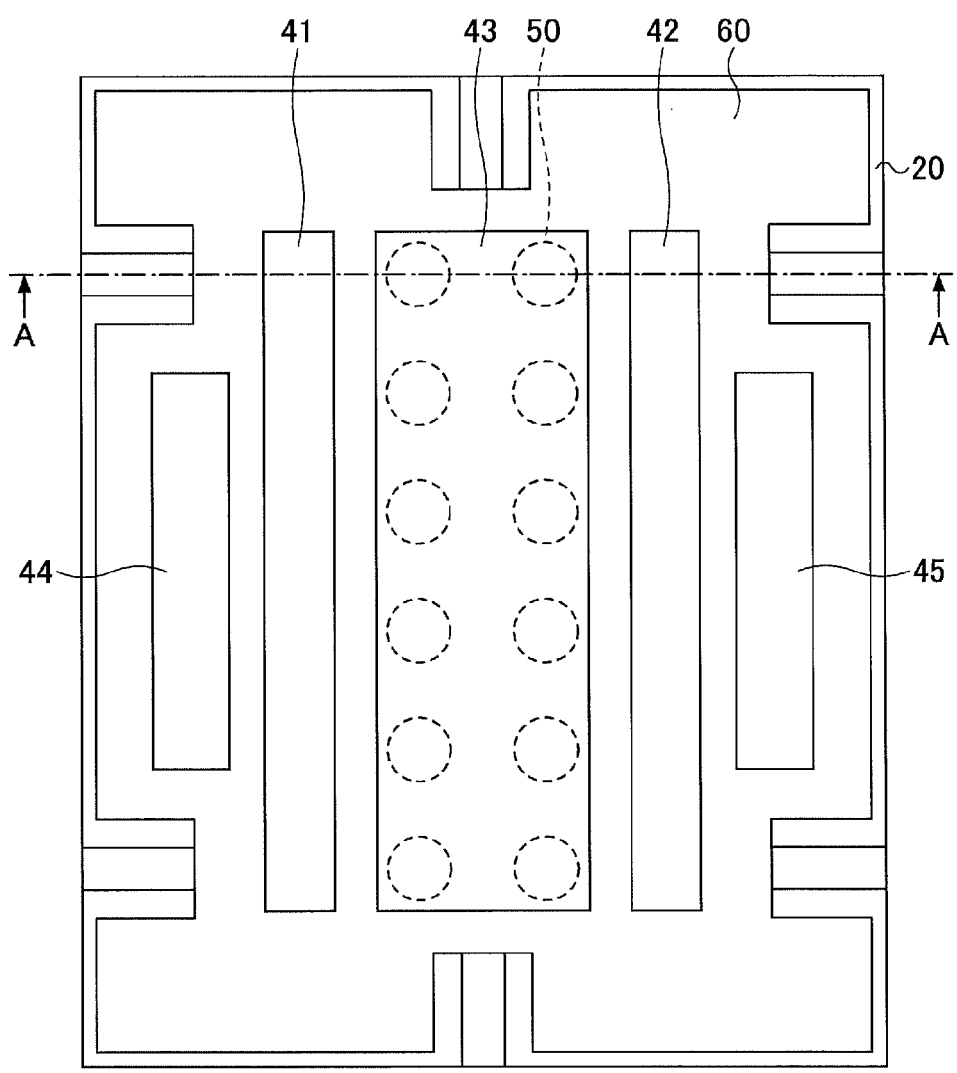

Then, in the process illustrated in FIGS. 5A and 5B (FIG. 5B is a plan view, and FIG. 5A is a cross-sectional view taken along the line A-A of FIG. 5B), the plating film 40 (plating films 41-45) is formed on the wiring 30 (wirings 31-33) by an electroplating method. More specifically, for example, a masking tape is adhered to the other surface side of the substrate 10. Then, the plating film 40 (plating films 41-45) are formed by the electroplating method using the bus-lines 31B, 32B, and 33B as power-feeding layers, so that the plating film 40 (plating films 41-45) are formed on the upper surfaces of the wiring 30 (wirings 31-33) exposed from the insulating layer 60. Then, the masking tape is removed. The materials and thicknesses of the plating film 40 are the same as those described above.

Then, in the process illustrated in FIGS. 6A and 6B (FIG. 6B is a plan view, and FIG. 6A is a cross-sectional view taken along the line A-A of FIG. 6B), the structural body of FIGS. 5A and 5B including, for example, the substrate 10 is cut into individual pieces (singulation). The structural body of FIGS. 5A-5B is cut into individual pieces by cutting a predetermined part (s) of the substrate 10. In this process, in a case where each of the areas in which the wiring substrate 1 is formed is cut into a rectangular shape, an end surface of each of the bus-lines 31B, 32B, and 33B may be exposed at an outer peripheral surface of each wiring substrate 1. Therefore, in a subsequent process of adhering the heat radiation plate 80 to the wiring substrate 1, a current leakage may occur between the wiring substrate 1 and the heat radiation plate 80.

However, in this embodiment, the notch part 1x that penetrates the structural body of FIGS. 5A-5B in the thickness direction of the structural body of FIGS. 5A-5B is formed in an area corresponding to the bus-lines 31B, 32B, and 33B. The notch part 1x is positioned (retracted) more inward relative to the outer edge part of the substrate 10 from a plan view. Thus, by cutting the wiring 30, and the bus-lines 31B, 32B, and 33B to form the notch part 1x, an end surface of the wiring 30 becomes exposed at a bottom part of the notch part 1x (an inner wall surface of the notch part 1x that is farthest from the outer peripheral side surface of the wiring substrate 1) from a plan view. As a result, a distance between the end surface of the wiring 30 and the heat radiation plate 80 can be gained, and a current leakage can be prevented from occurring.

It is to be noted that, because the wirings 31, 32 and the bus-lines 31B, 32B, 33B are integrally formed, there is no clear boundary between the wirings 31, 32 and the bus-lines 31B, 32B, 33B. Therefore, the parts of the wiring 30 that are removed from the structural body of FIGS. 5A and 5B by the forming of the notch part 1x are assumed as the bus-line 31B, 32B, and 33B, and the parts of the wiring 30 that remain on the substrate 10 in the structural body of FIGS. 6A and 6B are assumed as the wirings 31, 32, and 33.

The plan-view shape of the notch part 1x is not limited to a rectangular shape. For example, the plan-view shape of the notch part 1x may be a semi-circular shape, a semi-elliptical shape, or a more complex shape. The cutting of the structural body of FIGS. 5A and 5B and the forming of the notch part 1x may be performed by a pressing process, NC (Numerical Control) process, or a laser process. In the process illustrated in FIGS. 6A and 6B, an area that is formed on the wiring 30 along the inner wall surface of the notch part 1x (in the plan view) is exposed from the insulating layer 60. More specifically, the area of the plating film 40 that is formed on the wiring 30 along the inner wall surface of the notch part 1x is exposed from the insulating layer 60.

Figure 7A:
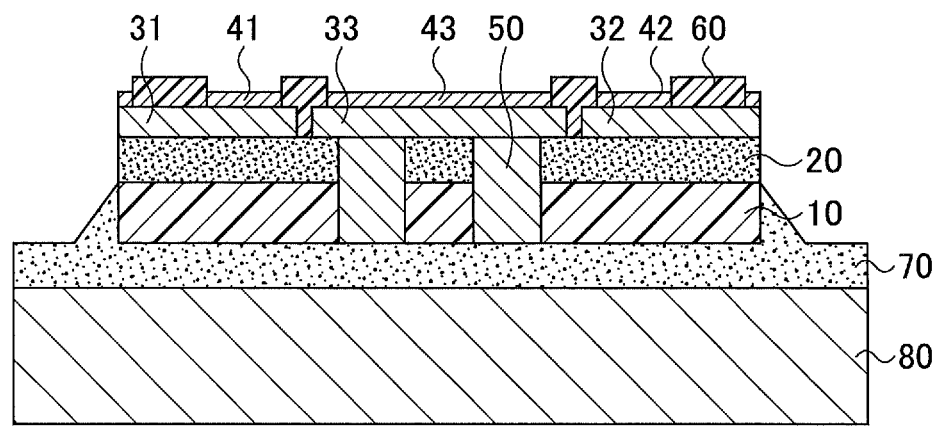
FIGS. 7A and 7B are schematic diagrams illustrating steps for manufacturing a light emitting device mounting package of the first embodiment (part 6)

Then, in the process illustrated in FIG. 7A, the singulated structural body of FIGS. 6A and 6B is fixed onto the heat radiation plate 80 interposed by the adhesive layer 70. That is, the structural body of FIGS. 6A and 6B is fixed onto the heat radiation plate 80 from the side of the substrate 10 having the adhesive layer 70 provided therebetween. Thereby, the manufacturing of the wiring substrate 1 is completed. More specifically, the adhesive layer 70 is formed by, for example, adhering an adhesive film on the heat radiation plate 80. The adhesive film may be, for example, a thermosetting epoxy type adhesive film that includes a filler such as alumina. Then, the singulated structural body of FIGS. 6A and 6B is positioned on the adhesive layer 70. Then, the adhesive layer 70 is formed by applying pressure to the singulated structural body of FIGS. 6A and 6B from the side of the heat radiation plate 80 while heating the structural body of FIGS. 6A and 6B to a predetermined temperature to cure the structural body. Alternatively, the adhesive layer 70 may be formed on the heat radiation plate 80 by a spin-coating process. In this case, a thermosetting epoxy type resin liquid or paste that includes a filler such as alumina may be used to form the adhesive layer 70.

Through the process of applying pressure to the structural body of FIGS. 6A and 6B and curing the structural body of FIGS. 6A and 6B, a part of the adhesive layer 70 rises in the notch part 1x to cover at least a part of the inner wall surface of the notch part 1x. In FIG. 7A, the adhesive layer 70 covers the end surface of the substrate 10 that is exposed in the inner wall surface of the notch part 1x. Alternatively, the adhesive layer 70 may continuously cover the end surface of the substrate 10, the end surface of the adhesive layer 20, and the end surface of the wiring 30 that are exposed in the inner wall surface of the notch part 1x as illustrated in portion E of FIG. 7B. Alternatively, the adhesive layer 70 may continuously cover the end surface of the substrate 10, the end surface of the adhesive layer 20, the end surface of the wiring 30, and the end surface of the plating film 40 that are exposed in the inner wall surface of the notch part 1x. Alternatively, the adhesive layer 70 may not only continuously cover the end surface of the substrate 10, the end surface of the adhesive layer 20, the end surface of the wiring 30, and the end surface of the plating film 40 that are exposed in the inner wall surface of the notch part 1x but further extend to cover a part of the adhesive layer 20 located at a periphery of the notch part 1x on which the insulating layer 60 is not formed. In this case, the adhesive layer 70 may extend to be formed on the wiring 30 (in this case, the upper surface of the plating film 40). FIG. 8B is a plan view, and FIG. 8A is a cross-sectional view taken along the line A-A of FIG. 8B.

By the adhesive layer 70 covering at least a part of the inner wall surface of the notch part 1x, the above-described effects (e.g., current leakage prevention) can be attained. The amount in which the adhesive layer 70 rises can be controlled by adjusting the thickness of the adhesive layer 70 formed on the heat radiation plate 80 and the pressurization conditions. The pressurization conditions include, for example, the temperature and pressure during the pressurization process, and the time of conducting the pressurization process.

Accordingly, with the wiring substrate 1 of the first embodiment, the adhesive layer 70 covers at least a part of the inner wall surface of the notch part 1x. Thereby, compared to a case where the adhesive layer 70 is adhered only to the other surface of the substrate 10, the bonding strength between the heat radiation plate 80 and the wiring part of the wiring substrate 1 can be improved. Thus, the risk of separation between the heat radiation plate 80 and the wiring substrate 1 can be reduced. This effect is particularly advantageous in a case where the wiring substrate 1 is repeatedly used in a low temperature environment and a high temperature environment.

Further, the end surface of the wiring 30 is exposed at the bottom part of the notch part 1x (the inner wall surface of the notch part 1x that is farthest from the outer peripheral side surface of the wiring substrate 1) from a plan view. Thereby, the distance between the end surface of the wiring 30 and the heat radiation plate 80 can be gained. Thus, a current leakage can be prevented from occurring.

Figure 9A:
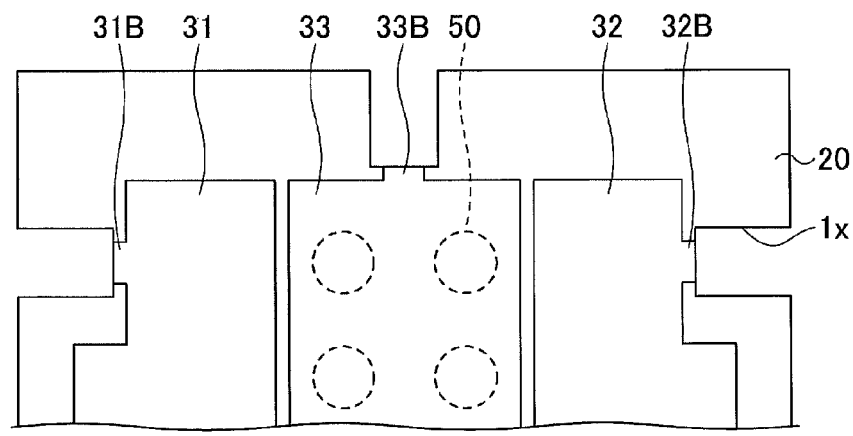
FIGS. 9A-9C are schematic diagrams for describing removal of a bus line.
Figure 9B:
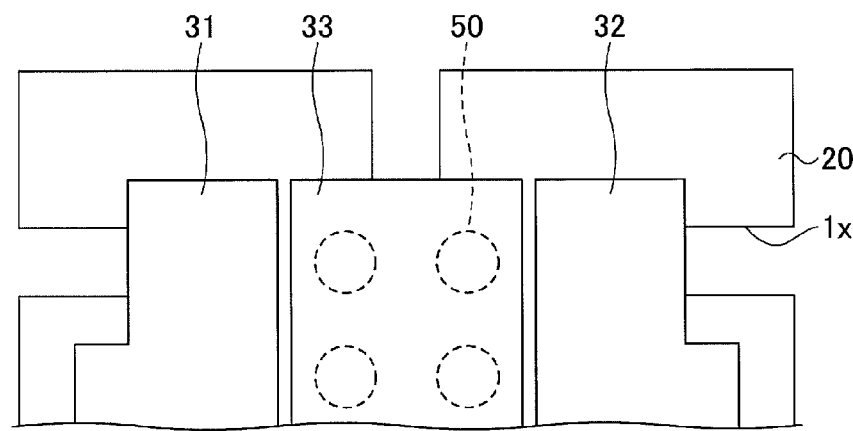

In the process illustrated in FIG. 6A, the notch part 1x is formed, so that a part of the bus-lines 31B, 32B, and 33B remains as illustrated in FIG. 9A. It is, however, preferable to form the notch part 1x by removing all of the bus-lines 31B, 32B, and 33B (i.e., no remaining bus-lines 31B, 32B, 33B), so that the bottom part of the notch part 1x (the inner wall surface of the notch part 1x that is farthest from the outer peripheral side surface of the wiring substrate 1) and the end surface of the wirings 31, 32, and 33 are flush from a plan view as illustrated in FIG. 9B. Thereby, in a case of using the end surface of the wiring 30 (31-33) as a test terminal, the end surface of the wiring 30 (wirings 31-33) can be exposed in the inner wall surface of the notch part 1x without being covered by the adhesive layer 70, and the wiring 30 exposed in the inner wall surface of the notch part 1x can be formed with fewer corners. Accordingly, a current leakage can be further prevented from occurring.

Figure 9C:
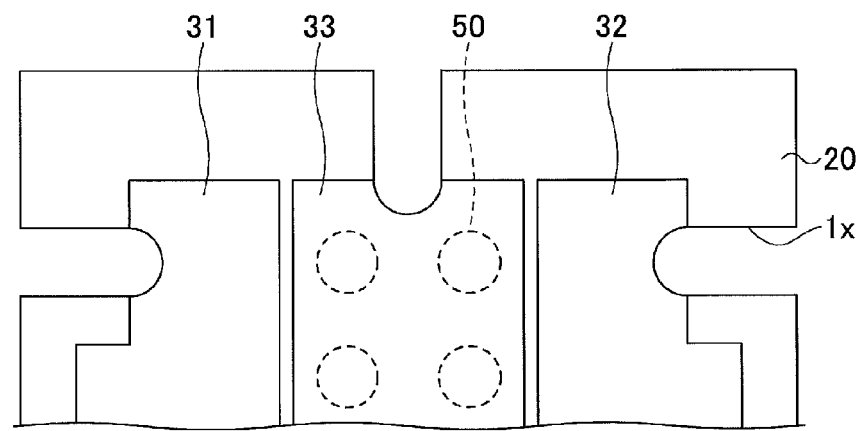

Alternatively, as illustrated in FIG. 9C, the notch part 1x may be formed by removing all of the bus-lines 31B, 32B, and 33B (i.e., no remaining bus-lines 31B, 32B, 33B) and further removing a part of the wiring 30, so that the bottom part of the notch part 1x has a curved surface from a plan view and is provided more inward than the end surface of the wiring 30 from a plan view. Thereby, similar to the example of FIG. 9B, the wiring 30 exposed in the inner wall surface of the notch part 1x can be formed with fewer corners. Accordingly, a current leakage can be further prevented from occurring.

Because FIGS. 9A-9C are for illustrating a positional relationship between the wiring 30 and the notch part 1x, other components are omitted from FIGS. 9A-9C. Further, in a case where only the wiring 31 and the wiring 32 are to be used as test terminals, the effects that are attained are the same regardless of whether the plan-view shape of the notch part 1x corresponding to the wiring 33 is any of the shapes illustrated in FIGS. 9A-9C.

Further, in a case where the adhesive layer 70 covers the end surface of the wiring 30, a conducting part of the wiring 30 can be prevented from being exposed from the end surface of the wiring 30. Accordingly, a current leakage can be further prevented from occurring.

In a case where the adhesive layer 70 does not cover the end surface of the wiring 30 exposed in the inner wall surface of the notch part 1x, the end surface of the wiring 30 may be used as a test terminal. For example, in a case of using the wiring 30 as a test terminal, a light emitting device may be mounted to the wiring substrate 1 in which both terminals of the light emitting device are connected to corresponding wirings 31 and 32 (plating films 41 and 42). Accordingly, by applying a predetermined voltage by contacting a pin to the end surface of the wiring 30, a predetermined potential difference can be applied to both terminals of the light emitting device to test the illumination of the light emitting device. In this case, the plating films 44 and 45 can be prevented from being damaged because the pin does not need to contact the plating films 44 and 45 for performing the illumination test.

First Modified Example of the First Embodiment

In a wiring substrate 1A according to the first modified example of the first embodiment, the shape of an insulating layer 61 is different from the shape of the insulating layer 60 of the first embodiment. In the first modified example of the first embodiment, like components/parts are denoted with like reference numerals as the reference numerals of the first embodiment and are not further explained.

Figure 10A:
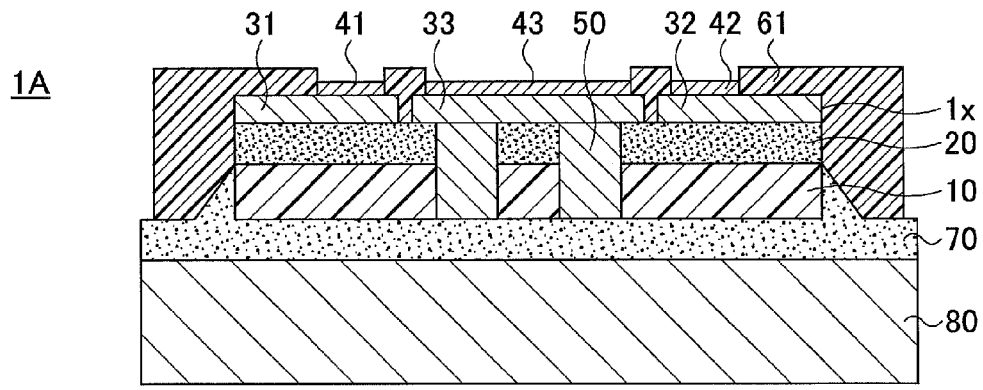
FIGS. 10A and 10B are schematic diagrams illustrating a wiring substrate according to a first modified example of the first embodiment.
Figure 10B:
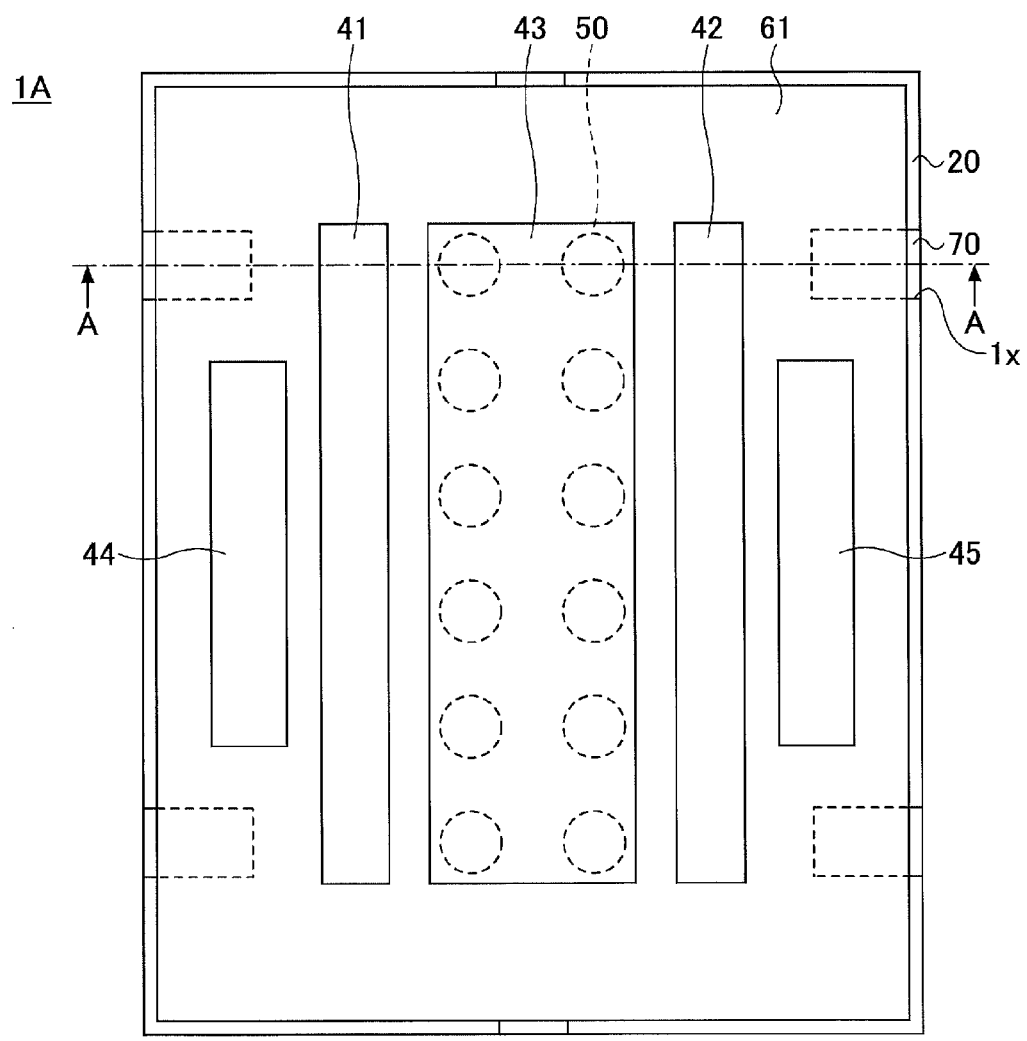

FIGS. 10A and 10B are schematic diagrams illustrating the wiring substrate 1A according to the first modified example of the first embodiment. FIG. 10B is a plan view, and FIG. 10A is a cross-sectional view taken along the line A-A of FIG. 10B. With reference to FIGS. 10A and 10B, the wiring substrate 1A is different from the wiring substrate 1 in that the insulating layer 60 is replaced with the insulating layer 61. The insulating layer 61 is formed to fill the notch part 1x, so that the insulating layer 61 is formed entirely on the wiring substrate 1A from a plan view except for an area where the plating film 40 is formed and an outer edge part of the adhesive layer 20. It is to be noted that the difference between the insulating layer 60 and the insulating layer 61 is only their shapes, and the same materials and the like may be used to form the insulating layer 61. Next, an example of forming the insulating layer 61 is described.

FIGS. 11A-13B are schematic diagrams illustrating processes for manufacturing the wiring substrate 1A according to the first modified example of the first embodiment. The following cross-sectional views used for describing the processes for manufacturing the wiring substrate 1A of the first modified example of the first embodiment (FIGS. 11A-11C, 12A, 13A) correspond to the cross-sectional view of FIG. 10A.

Figure 11A:
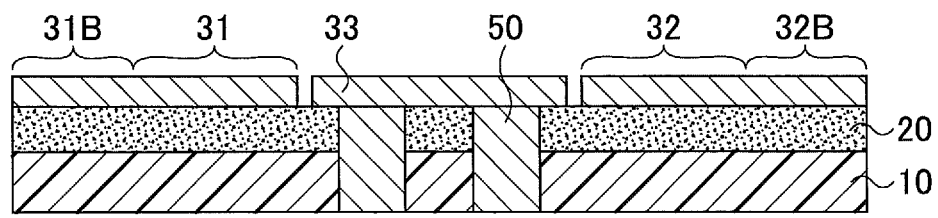
FIGS. 11A-11C are schematic diagrams illustrating steps for manufacturing a wiring substrate of the first modified example (part 1)

First, in the process illustrated in FIG. 11A, similar to the processes illustrated in FIGS. 3A and 3B, the wirings 31-33 and the bus-lines 31B-33B that are connected to the wirings 31-33 are formed by performing a patterning process on the metal layer 30A.

Figure 11B:
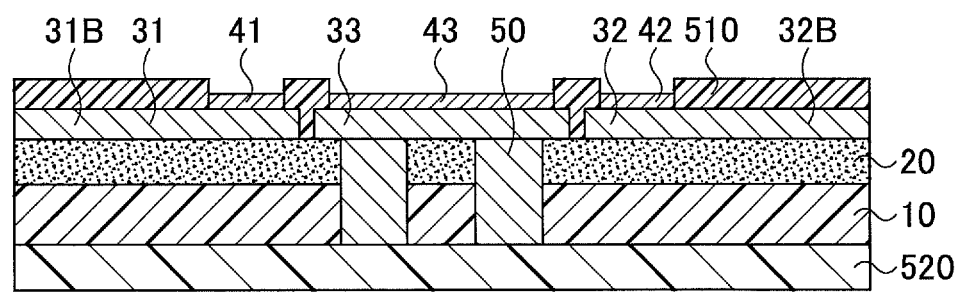

Then, in the process illustrated in FIG. 11B, the plating film 40 (plating films 41-43) is formed on the wiring 30 (wirings 31-33) by an electroplating method. More specifically, for example, a resist film 510 for selectively exposing a predetermined part of an upper surface of the wiring 30 (i.e., a part in which the plating film 40 is formed in FIGS. 10A and 10B) is formed on the adhesive layer 20. Further, a masking tape 520 is adhered to the other surface side of the substrate 10. Then, the plating film 40 is formed by the electroplating method using the bus-lines 31B, 32B, and 33B as power-feeding layers, so that the plating film 40 is formed on the upper surface of the wiring 30 exposed from the resist film 510. The materials and thicknesses of the plating film 40 are the same as those described above. Then, in the process illustrated in FIG. 11C, the resist film 510 and the masking tape 520 are removed.

Figure 11C:
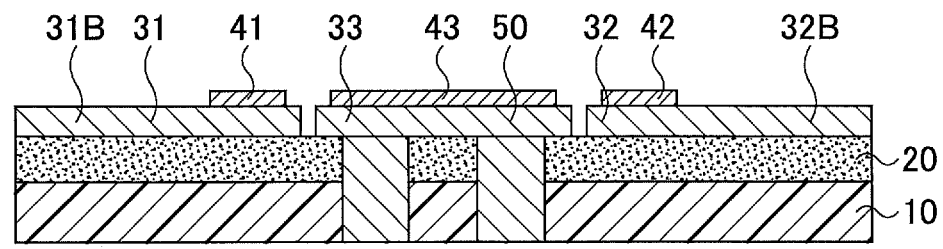
Figure 12A:
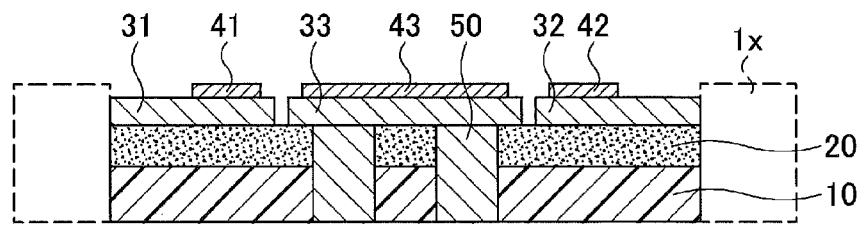
FIGS. 12A and 12B are schematic diagrams illustrating a step for manufacturing a wiring substrate of the first modified example (part 2)
Figure 12B:
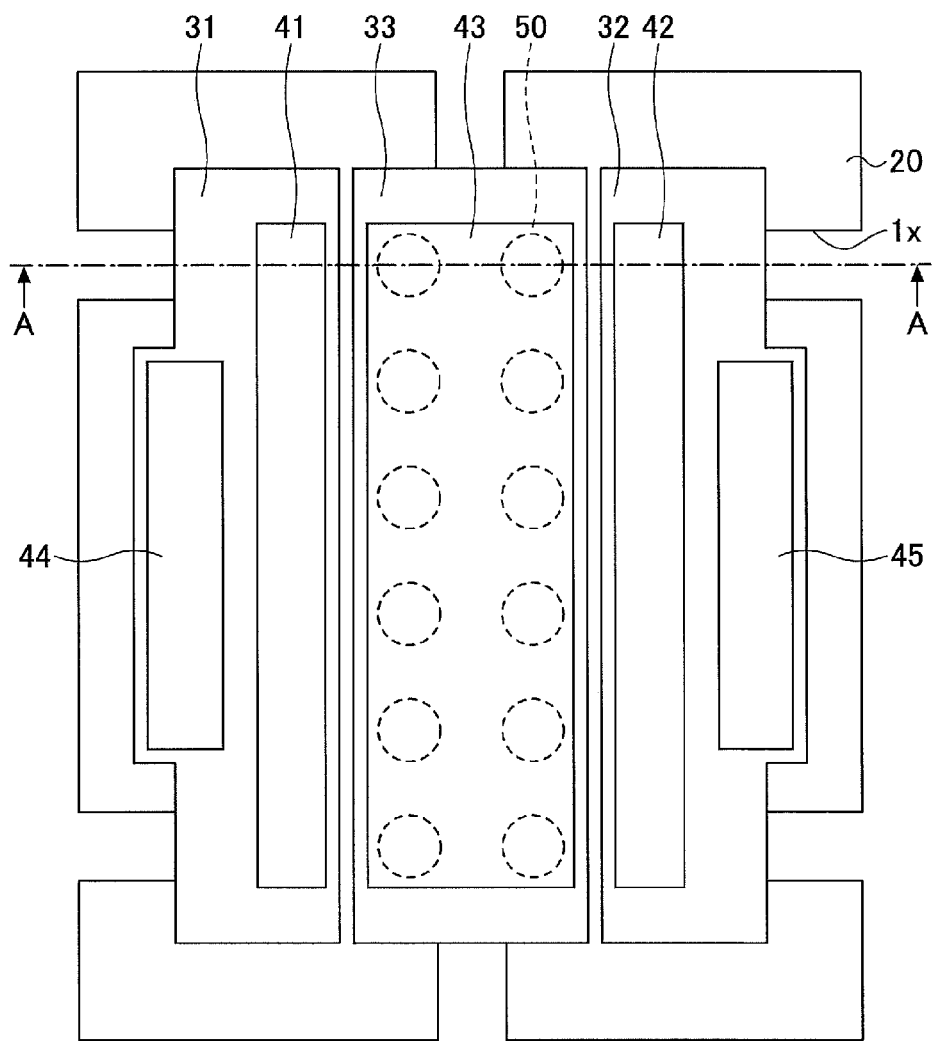

Then, in the process illustrated in FIGS. 12A and 12B (FIG. 12B is a plan view, and FIG. 12A is a cross-sectional view taken along the line A-A of FIG. 12B), the structural body of FIG. 11C including, for example, the substrate 10 is cut into individual pieces by cutting a predetermined part (s) of the structural body. In this process, similar to FIGS. 6A and 6B, the bus-lines 31B, 32B, and 33B are removed to form the notch part 1x that penetrates the substrate 10 and the adhesive layer 20. The end surface of the wiring 30 becomes exposed at the bottom part of the notch part 1x (an inner wall surface of the notch part 1x that is farthest from the outer peripheral side surface of the wiring substrate 1) from a plan view. Thereby, the distance between the end surface of the wiring 30 and the heat radiation plate 80 can be gained, and a current leakage can be prevented from occurring. The plan-view shape of the notch part 1x is not limited to a rectangular shape. For example, the plan-view shape of the notch part 1x may be a semi-circular shape, a semi-elliptical shape, or a more complex shape.

Figure 7B:
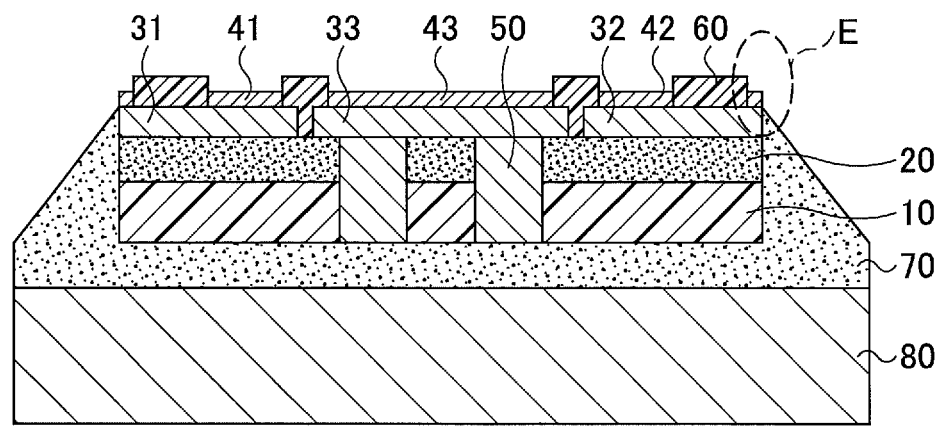
Figure 13A:
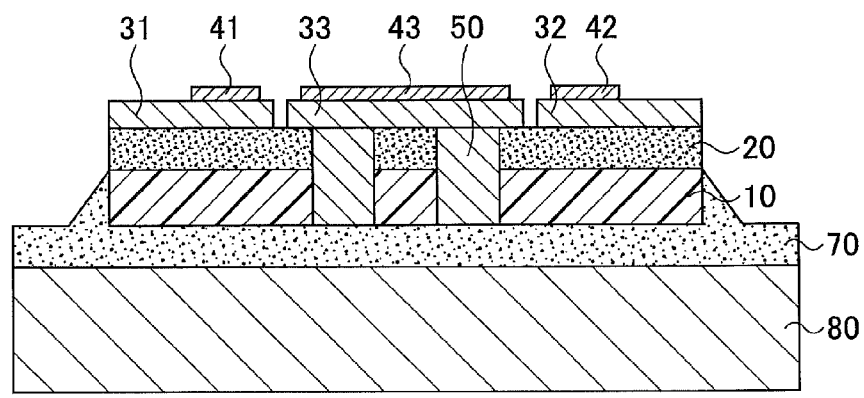
FIGS. 13A and 13B are schematic diagrams illustrating a step for manufacturing a wiring substrate of the first modified example (part 3)
Figure 13B:
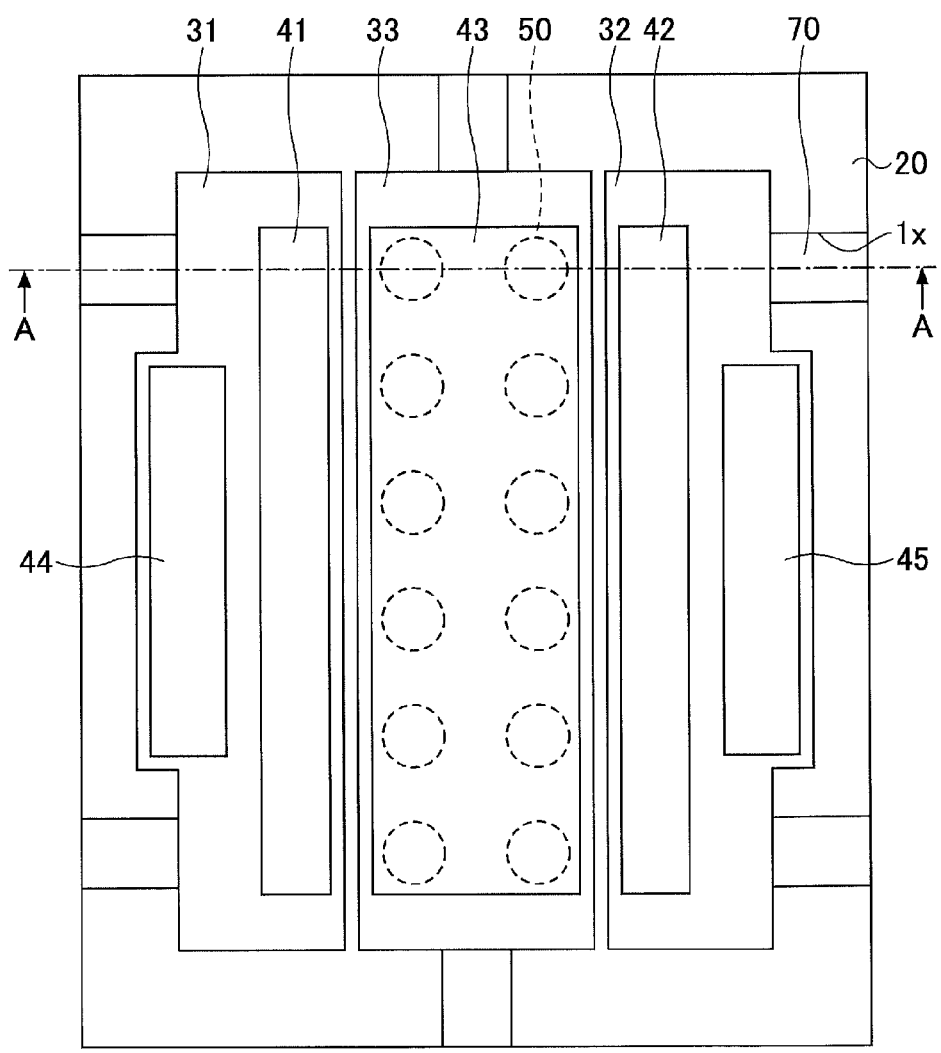

Then, in the process illustrated in FIGS. 13A and 13B (FIG. 13B is a plan view, and FIG. 13A is a cross-sectional view taken along the line A-A of FIG. 13B), the singulated structural body of FIGS. 12A and 12B is fixed onto the heat radiation plate 80 interposed by the adhesive layer 70. Similar to the process illustrated in FIG. 7A, a part of the adhesive layer 70 rises in the notch part 1x to cover at least a part of the inner wall surface of the notch part 1x in the process of FIGS. 13A and 13B. In FIG. 13A, the adhesive layer 70 covers the end surface of the substrate 10 that is exposed in the inner wall surface of the notch part 1x. However, the adhesive layer 70 may also cover other parts as illustrated in FIGS. 7B and 8A.

The insulating layer 61 is formed to fill the notch part 1x, so that the insulating layer 61 is formed entirely on the wiring substrate 1A from a plan view except for an area where the plating film 40 is formed and an outer edge part of the adhesive layer 20. The insulating layer 61 may be formed by using, for example, a screen-printing method. The wiring substrate 1A according to the first modified example of the first embodiment not only can attain the effects attained by the wiring substrate 1 of the first embodiment but can also attain the following effects. That is, an area for reflecting light radiated from a light emitting device 110 can be increased by forming the insulating layer 61 to fill the notch part 1x, so that the insulating layer 61 is formed entirely on the wiring substrate 1A from a plan view except for an area where the plating film 40 is formed and an outer edge part of the adhesive layer 20. Thereby, the light radiated from the light emitting device can be used more efficiently (an improvement of light efficiency).

Second Modified Example of the First Embodiment

In the wiring substrates 1B and 1C according to the second modified example of the first embodiment, the area for forming the plating film 43 is different from the area for forming the plating film 43 of the first embodiment. In the second modified example of the first embodiment, like components/parts are denoted with like reference numerals as the reference numerals of the first embodiment and are not further explained.

Figure 14A:
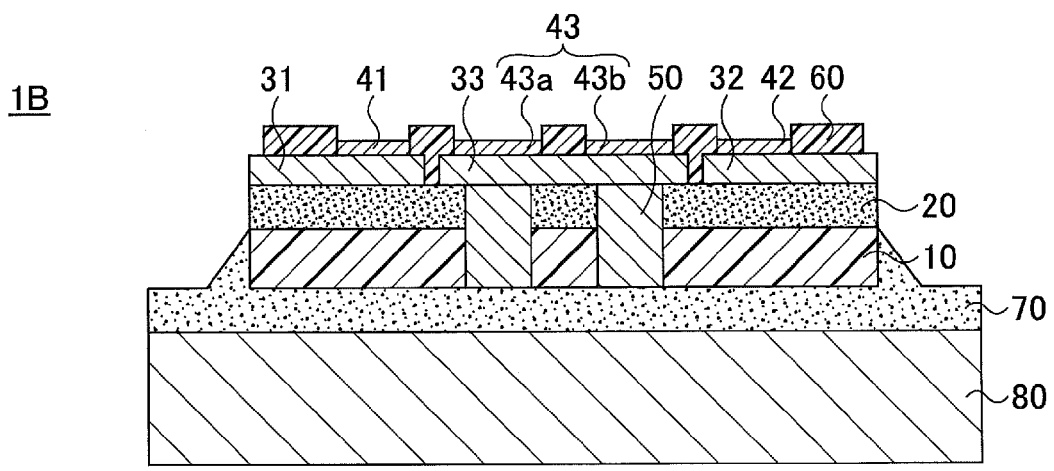
FIGS. 14A and 14B are schematic diagrams illustrating a wiring substrate according to a second modified example of the first embodiment.
Figure 14B:
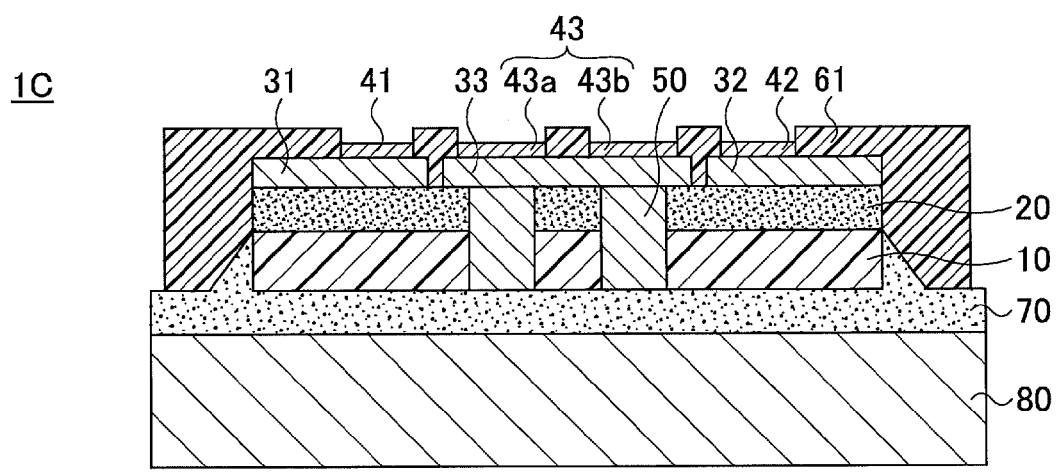

FIGS. 14A and 14B are schematic diagrams illustrating the wiring substrates 1B and 1C according to the second modified example of the first embodiment. As illustrated in the wiring substrates 1B and 1C of FIGS. 14A and 14B, the plating film 43 may be divided into strip-like plating films 43a, 43b that are aligned at a predetermined interval (see also FIGS. 18A and 18B). The insulating layer 60 or the insulating layer 61 is formed between the plating film 43a and the plating film 43b to divide the plating film 43 into the plating film 43a and the plating film 43B. However, because both the plating film 43a and the plating film 43b are formed on the wiring 33, the plating film 43a and the plating film 43b are electrically connected to each other.

The wiring substrate 1B can be manufactured by using, for example, the above-described manufacturing method used in the first embodiment. The wiring substrate 1C can be manufactured by using, for example, the above-described manufacturing method used in the first modified example of the first embodiment.

Accordingly, the plating film 43 may be divided into two plating films 43a and 43b to match a semiconductor device (light emitting device) that is to be mounted on the wiring substrate 1B or 1C.

Third Modified Example of the First Embodiment

In a wiring substrate 1D according to the third modified example of the first embodiment, an insulating film 39 is formed on an end surface of the wiring 30 and an end surface of the through-wiring 50. In the third modified example of the first embodiment, like components/parts are denoted with like reference numerals as the reference numerals of the first embodiment and are not further explained.

Figure 15A:
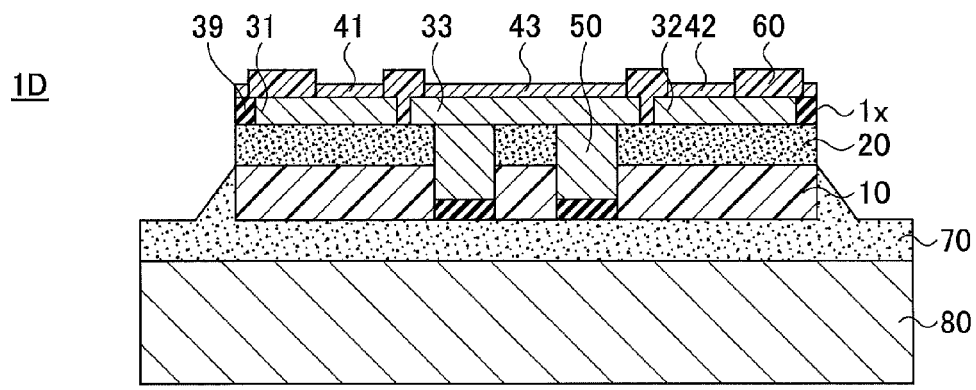
FIGS. 15A and 15B are schematic diagrams illustrating a wiring substrate according to a third modified example of the first embodiment.
Figure 15B:
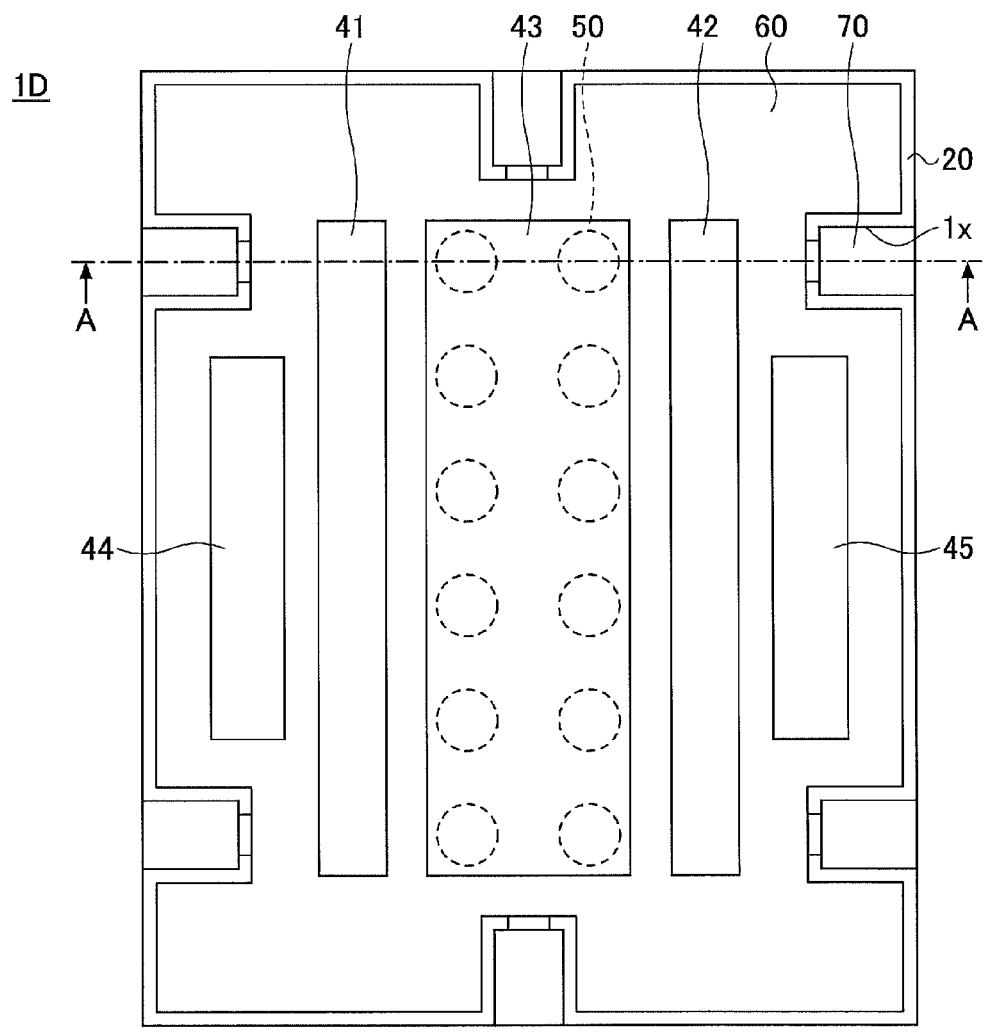

FIGS. 15A-15B are schematic diagrams illustrating the wiring substrate 1D according to the third modified example of the first embodiment. FIG. 15B is a plan view, and FIG. 15A is a cross-sectional view taken along the line A-A of FIG. 15B. With reference to FIGS. 15A and 15B, the wiring substrate 1D is different from the wiring substrate 1 (see FIG. 1A) in that the insulating film 39 is formed on the end surface of the wiring 30 on a side of the inner wall surface of the notch part 1x and on the end surface (other end) of the through-wiring 50 on a side of the adhesive layer 70. Although each end surface of the substrate 10, the adhesive layer 20, the insulating film 39, and the plating film 40 is exposed at the inner wall surface of the notch part 1x, the end surface of the wiring 30 is not exposed at the inner wall surface of the notch part 1x.

In a case where the wiring 30 and the through-wiring 50 are formed of copper (Cu), the insulating film 39 may be, for example, an oxide film, that is, a film formed of CuO. The thickness of the insulating film 39 may be, for example, approximately 1 μm to 30 μm. Next, an example of forming the insulating film 39 is described.

Figure 16A:
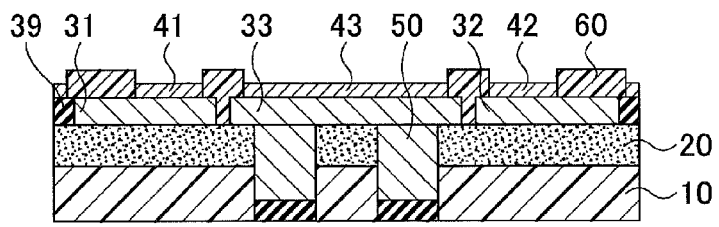
FIGS. 16A-16C are schematic diagrams illustrating steps for manufacturing a wiring substrate of the third modified example.
Figure 16B:
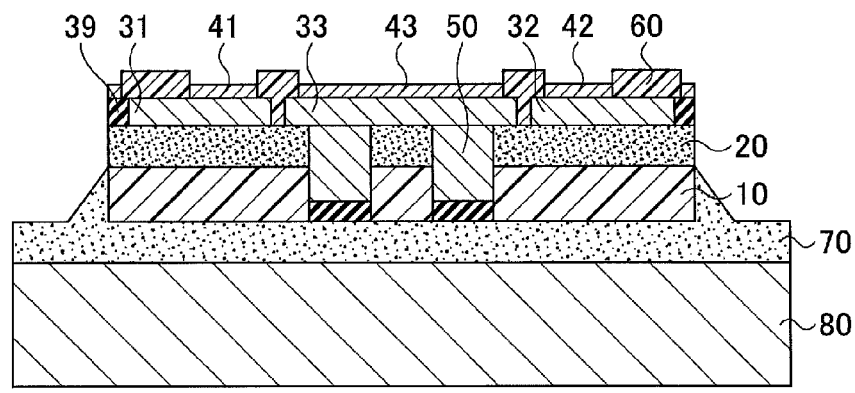
Figure 16C:
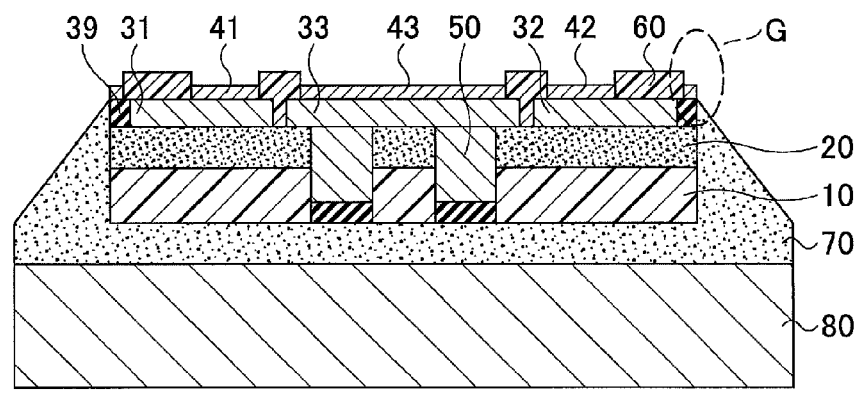

FIGS. 16A-16C are schematic diagrams illustrating processes for manufacturing the wiring substrate 1D according to the third modified example of the first embodiment. The following cross-sectional views used for describing the processes for manufacturing the wiring substrate 1D of the third modified example of the first embodiment (FIGS. 16A-16C) correspond to the cross-sectional view of FIG. 15A.

First, processes similar to those illustrated in FIGS. 2A-6A are performed. Then, in the process illustrated in FIG. 16A, the insulating film 39 is formed on the end surface of the wiring 30 (end surfaces of the bus-lines 31B, 32B, and 33B) exposed at the outer peripheral side surface of the structural body of FIG. 6A. The insulating film 39 is also formed on the end surface (other end) of the through-wiring 50 exposed at the lower surface of the structural body of FIG. 6A. The insulating film 39 may be formed by using, for example, a black oxide process or a thermal process using an oven or the like. In a case where the wiring 30 (bus-lines 31B, 32B, and 33B) and the through-wiring 50 are formed of copper (Cu), the insulating film 39 may be, for example, an oxide film, that is, a film formed of CuO. The thickness of the insulating film 39 may be, for example, approximately 1 μm to 30 μm. It is to be noted that the insulating film 39 is not formed on the surface of the wiring 30 that is covered by the plating film 40.

Then, in the process illustrated in FIG. 16B, similar to the process illustrated in FIG. 7A, the structural body of FIG. 16A is fixed onto the heat radiation plate 80 interposed by the adhesive layer 70. That is, the structural body of FIG. 16A is fixed onto the heat radiation plate 80 from the side of the substrate 10 having the adhesive layer 70 provided therebetween. Thereby, the manufacturing of the wiring substrate 1D is completed. It is to be noted that, through the process of applying pressure to the structural body of FIG. 16B and curing the structural body of FIG. 16B, a part of the adhesive layer 70 rises in the notch part 1x to cover at least a part of the inner wall surface of the notch part 1x. In FIG. 16B, the adhesive layer 70 covers the end surface of the substrate 10 that is exposed in the inner wall surface of the notch part 1x. Alternatively, the adhesive layer 70 may continuously cover the end surface of the substrate 10, the end surface of the adhesive layer 20, and the end surface of the insulating film 39 that are exposed in the inner wall surface of the notch part 1x as illustrated in portion G of FIG. 16C. Alternatively, the adhesive layer 70 may continuously cover the end surface of the substrate 10, the end surface of the adhesive layer 20, the end surface of the insulating film 39, and the end surface of the plating film 40 that are exposed in the inner wall surface of the notch part 1x.

Alternatively, the adhesive layer 70 may not only continuously cover the end surface of the substrate 10, the end surface of the adhesive layer 20, the end surface of the insulating film 39, and the end surface of the plating film 40 that are exposed in the inner wall surface of the notch part 1x but further extend to cover a part of the adhesive layer 20 located at a periphery of the notch part 1x on which the insulating layer 60 is not formed. In this case, the adhesive layer 70 may extend to be formed on the wiring 30 (in this case, the upper surface of the plating film 40).

Hence, according to the third modified example of the first embodiment, the insulating film 39 may be formed on the end surface of the wiring 30 (end surfaces of the bus-lines 31B, 32B, and 33B) and on the end surface (other end) of the through-wiring 50. By forming the insulating film 39 on the end surface of the through-wiring 50, the insulation resistance between the through-wiring 50 and the heat radiation plate 80 can be improved. Thereby, the thickness of the adhesive layer 70 can be reduced. As a result, the thickness of the entire wiring substrate 1D can be reduced. Further, by forming the insulating film 39 on the end surface of the wiring 30, the insulating resistance against, for example, corona discharge can be improved.

Further, compared to a case of directly covering the end surface of the through-wiring 50 with the adhesive layer 70, the bonding strength between the through-wiring 50 and the adhesive layer 70 can be improved by covering the end surface of the through-wiring 50 with the adhesive layer 70 interposed by the insulating film 39. Further, compared to a case of directly covering the end surface of the wiring 30 with the adhesive layer 70, the bonding strength between the end surface of the wiring 30 and the adhesive layer 70 can be improved by covering the end surface of the wiring 30 with the adhesive layer 70 interposed by the insulating film 39.

Alternatively, the wiring substrate 1D may have a structure that has the insulating film 39 formed only on either the end surface of the wiring 30 on the side of the inner wall surface of the notch part 1x or the end surface (other end) of the through-wiring 50 on the side of the adhesive layer 70.

Second Embodiment

The second embodiment illustrates an example of a semiconductor package having a semiconductor device (light emitting device) mounted on, for example, the wiring substrate 1 of the first embodiment. In the second embodiment, like components/parts are denoted with like reference numerals as the reference numerals of the first embodiment and are not further explained.

Figure 17A:
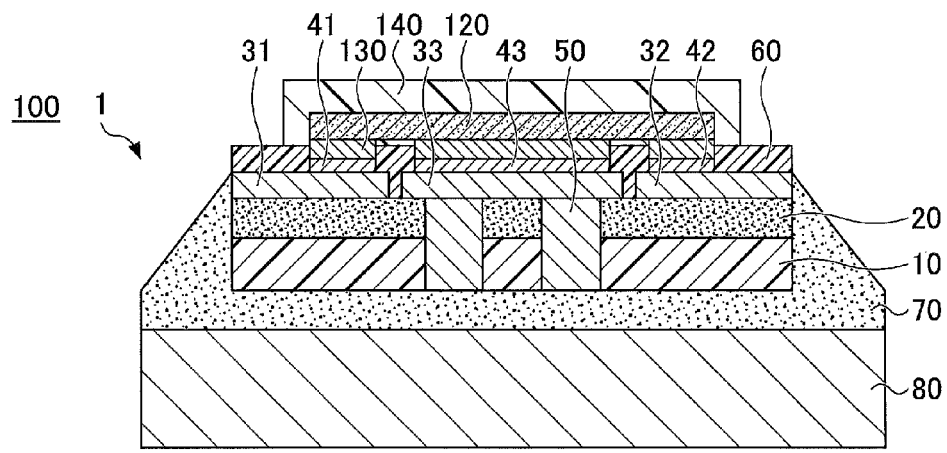
FIGS. 17A and 17B are schematic diagrams illustrating a semiconductor package according to a second embodiment of the present invention.
Figure 17B:
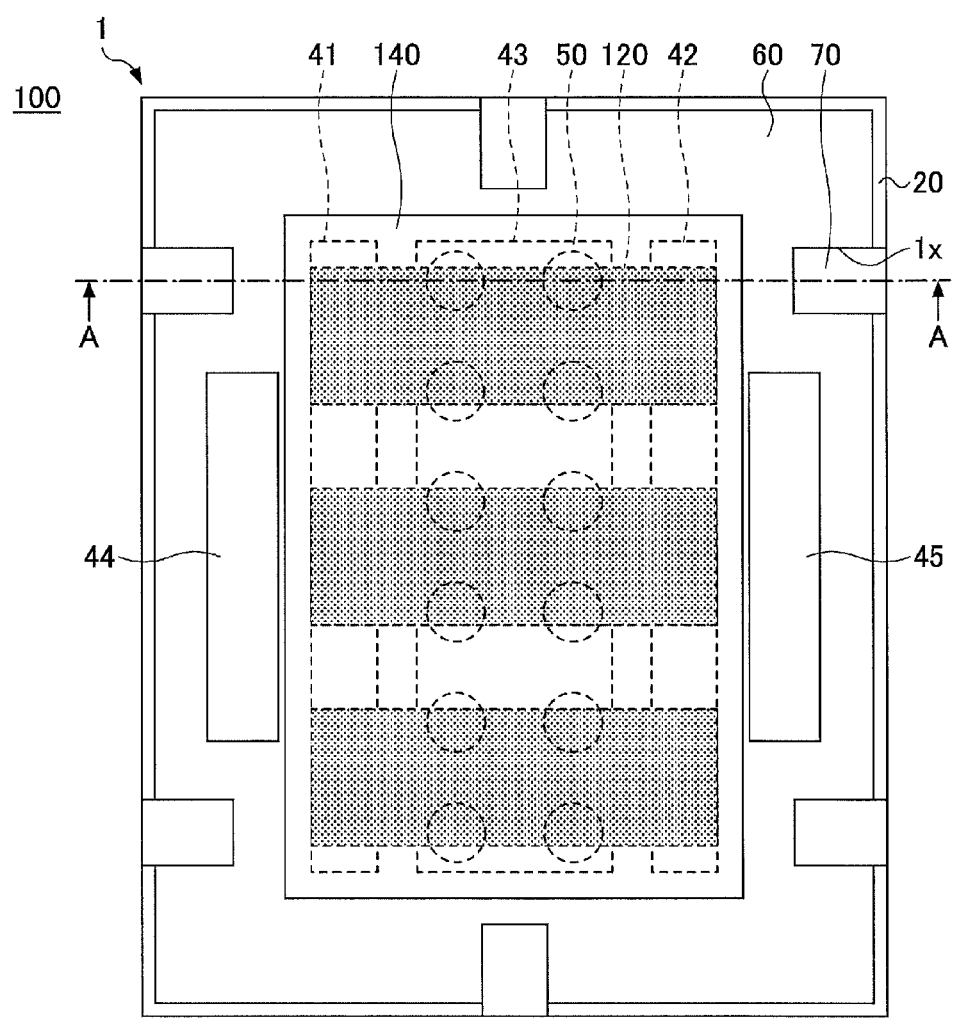

FIG. 17B is a plan view, and FIG. 17A is a cross-sectional view taken along the line A-A of FIG. 17B. For the sake of convenience, a semiconductor device 120 is illustrated with a matte pattern in FIG. 17B. With reference to FIGS. 17A and 17B, a semiconductor package 100 includes the wiring substrate 1 (see FIGS. 1A and 1B), the semiconductor device 120, a solder 130, and an encapsulating resin 140. The semiconductor device 120 is mounted on a surface of the wiring 33 exposed from the insulating layer 60. More specifically, the semiconductor device 120 is flip-chip bonded, in a face-down state, onto the wiring substrate 1 interposed by the solder 130. The semiconductor device 120 is encapsulated by the encapsulating resin 140. For example, the encapsulating resin 140 may be an insulating resin (e.g., epoxy type resin, silicone type resin) including a fluorescent material. Although three semiconductor devices 120 are aligned on the wiring substrate 1 in the example of FIGS. 17A and 17B, the number of semiconductor devices 120 mounted on the wiring substrate 1 is arbitrary.

The semiconductor device 120 may be, for example, an LED (Light Emitting Diode). The LED includes an anode terminal formed on one end of its lower surface (surface facing the wiring substrate 1) and a cathode terminal formed on the other end of the lower surface. However, the semiconductor device 120 is not limited to an LED. For example, a surface emitting laser may be used as the semiconductor device 120. In the second embodiment, the semiconductor device 120 is described as an LED.

For example, in the semiconductor device 120, one of the anode terminal and the cathode terminal is connected to the plating film 41 interposed by the solder 130 whereas the other one of the anode terminal and the cathode terminal is connected to the plating film 42 interposed by the solder 130. Further, a heat radiation terminal (not illustrated) is provided in the vicinity of a center part of the lower surface of the semiconductor device 120. The heat radiation terminal is connected to the plating film 43 interposed by the solder 130.

For example, the plating films 44 and 45 are connected to a power source or a drive circuit that is provided outside of the semiconductor package 100, so that a predetermined potential difference can be applied between the cathode terminal and the anode terminal of the semiconductor device 120. By applying the predetermined potential difference, the semiconductor device 120 is illuminated. The semiconductor device 120 generates heat when the semiconductor device 120 illuminates. The heat generated by the semiconductor device 120 is transmitted to the through-wiring 50 byway of the plating film 43 and the wiring 33, and is further transmitted to the heat radiation plate 80 by way of the adhesive layer 70. Thereby, the heat radiation plate 80 radiates the heat transmitted thereto. Because multiple through-wirings 50 are provided on the lower side of the heat radiation terminal of the semiconductor device 120, the heat generated by the semiconductor device 120 can be efficiently transmitted to the heat radiation plate 80.

First Modified Example of the Second Embodiment

The first modified example of the second embodiment illustrates another example of a semiconductor package having a semiconductor device (light emitting device) mounted on, for example, the wiring substrate 1 of the first embodiment. In the first modified example of the second embodiment, like components/parts are denoted with like reference numerals as the reference numerals of the first and second embodiments and are not further explained.

Figure 18A:
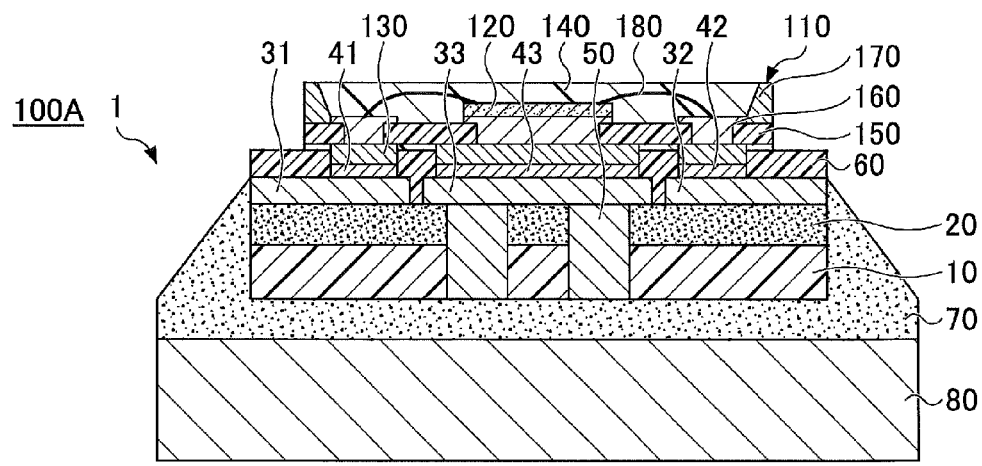
FIGS. 18A and 18B are schematic diagrams illustrating a semiconductor package according to a first modified example of the second embodiment.
Figure 18B:
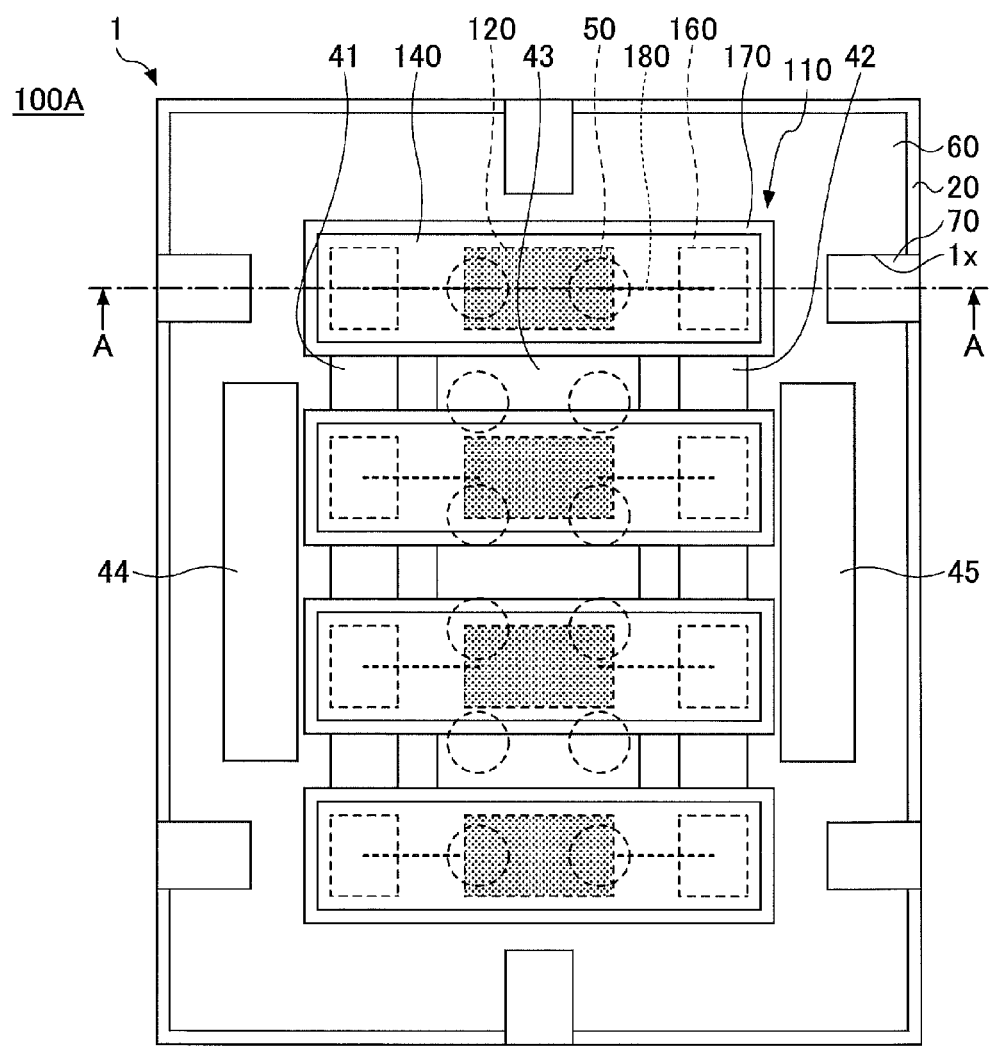

FIG. 18B is a plan view, and FIG. 18A is a cross-sectional view taken along the line A-A of FIG. 18B. For the sake of convenience, a semiconductor device 120 is illustrated with a matte pattern in FIG. 18B. With reference to FIGS. 18A and 18B, a semiconductor package 100A includes the wiring substrate 1 (see FIGS. 1A and 1B) and semiconductor modules 110. Although four semiconductor modules 110 are aligned on the wiring substrate 1 in the example of FIGS. 18A and 18B, the number of semiconductor modules 110 mounted on the wiring substrate 1 is arbitrary.

In the semiconductor module 110, a wiring 160 is formed on a substrate 150. The wiring 160 includes two electric connection terminals that are electrically connected to the semiconductor device 120, and a heat radiation terminal that is not electrically connected to the semiconductor device 120. The heat radiation terminal is to be apart on which the semiconductor device 120 is mounted. More specifically, the semiconductor device (LED) 120 is mounted in a face-up state on an upper surface of the heat radiation terminal. The upper surface of the two electric connection terminals of the wiring 160 are connected to corresponding anode and cathode terminals (not illustrated) of the semiconductor device 120 by way of a bonding wire 180. A reflector 170 for reflecting the light emitting from the semiconductor device 120 is mounted on an outer edge part of the upper surface of the substrate 150. Further, an encapsulating resin 140 for encapsulating the semiconductor device 120 is provided in an inner side of the reflector 170.

The lower surfaces of the two electric connection terminals of the wiring 160 are exposed from the lower surface of the substrate 150 and connected to corresponding plating films 41, 42 interposed by the solder 130. The lower surface of the heat radiation terminal of the wiring 160 is exposed from the lower surface of the substrate 150 and connected to the plating film 43 interposed by the solder 130.

For example, the plating films 44 and 45 are connected to a power source or a drive circuit that is provided outside of the semiconductor package 100, so that a predetermined potential difference can be applied between the cathode terminal and the anode terminal of the semiconductor device 120. By applying the predetermined potential difference, the semiconductor device 120 is illuminated. The semiconductor device 120 generates heat when the semiconductor device 120 illuminates. The heat generated by the semiconductor device 120 is transmitted to the through-wiring 50 by way of the heat radiation terminal of the wiring 160, the plating film 43 and the wiring 33, and is further transmitted to the heat radiation plate 80 by way of the adhesive layer 70. Thereby, the heat radiation plate 80 radiates the heat transmitted thereto. Because multiple through-wirings 50 are provided on the lower side of the heat radiation terminal of the semiconductor device 120, the heat generated by the semiconductor device 120 can be efficiently transmitted to the heat radiation plate 80.

Second Modified Example of the Second Embodiment

The second modified example of the second embodiment illustrates another example of a semiconductor package having a semiconductor device (light emitting device) mounted on, for example, the wiring substrate 1 of the first embodiment. In the second modified example of the second embodiment, like components/parts are denoted with like reference numerals as the reference numerals of the first and second embodiments and are not further explained.

Figure 19A:
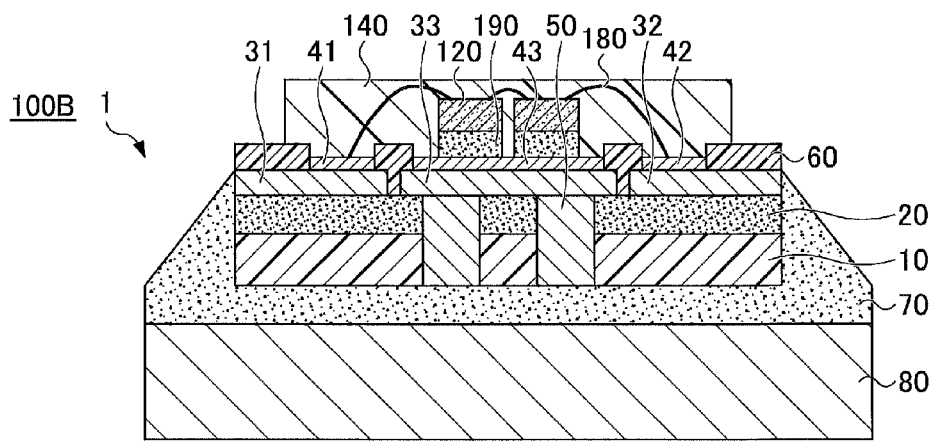
FIGS. 19A and 19B are schematic diagrams illustrating a semiconductor package according to a second modified example of the second embodiment.
Figure 19B:
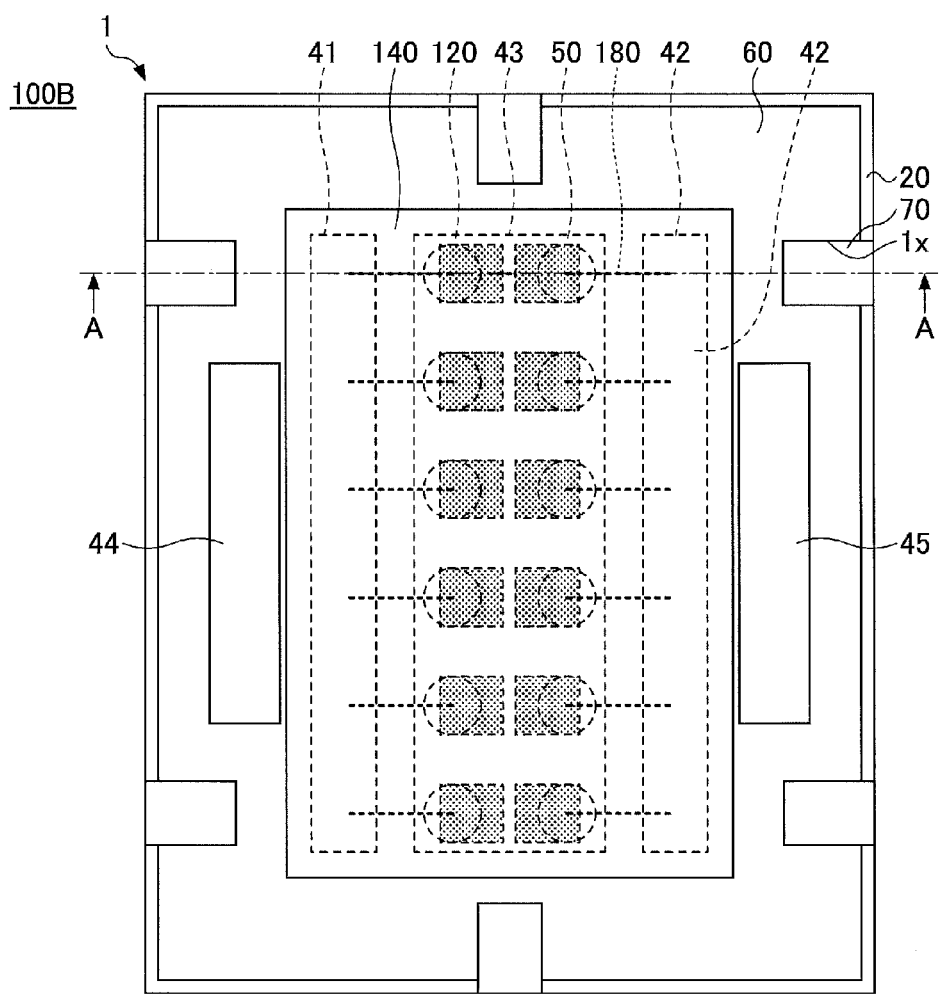

FIG. 19B is a plan view, and FIG. 19A is a cross-sectional view taken along the line A-A of FIG. 19B. For the sake of convenience, a semiconductor device 120 is illustrated with a matte pattern in FIG. 19B. With reference to FIGS. 19A and 19B, the semiconductor package 100B includes multiple semiconductor devices 120 mounted on the plating film 43 of the wiring substrate 1 (see FIGS. 1A and 1B). More specifically, the semiconductor devices 120 are mounted, in a face-up state, onto the plating film 43 interposed by an adhesive layer (e.g., die attach film) 190. Each of the semiconductor devices 120 is encapsulated by the encapsulating resin 140. Although twelve semiconductor devices 120 are mounted on the wiring substrate 1 in the example of FIGS. 19A and 19B, the number of semiconductor devices 120 mounted on the wiring substrate 1 is arbitrary.

Two semiconductor devices 120 are arranged in a lateral direction of the plating film 43 (direction in which the plating films 41-45 are aligned) and connected in series by way of the bonding wire 180. For example, an anode terminal of one of the two semiconductor devices 120 arranged in the lateral direction of the plating film 43 is connected to a cathode terminal of the other one of the two semiconductor devices 120 by way of the bonding wire 180. Further, for example, a cathode terminal of the one of the two semiconductor devices 120 is connected to the plating film 41 by way of the bonding wire 180 whereas an anode terminal of the other one of the two semiconductor devices 120 is connected to the plating film 42 by way of the bonding wire 180. Further, multiple sets (in this example, six sets) of the two semiconductor devices 120 that are serially connected in the lateral direction of the plating film 43 are connected in parallel in a longitudinal direction of the plating film.

For example, the plating films 44 and 45 are connected to a power source or a drive circuit that is provided outside of the semiconductor package 100B, so that a predetermined potential difference can be applied between the cathode terminal and the anode terminal of the semiconductor device 120. By applying the predetermined potential difference, the semiconductor device 120 is illuminated. The semiconductor device 120 generates heat when the semiconductor device 120 illuminates. The heat generated by the semiconductor device 120 is transmitted to the through-wiring 50 by way of the plating film 43 and the wiring 33, and is further transmitted to the heat radiation plate 80 by way of the adhesive layer 70. Thereby, the heat radiation plate 80 radiates the heat transmitted thereto. Because multiple through-wirings 50 are provided on the lower side of the heat radiation terminal of the semiconductor device 120, the heat generated by the semiconductor device 120 can be efficiently transmitted to the heat radiation plate 80.

Third Modified Example of the Second Embodiment

The third modified example of the second embodiment illustrates another example of a semiconductor package having a semiconductor device (light emitting device) mounted on, for example, the wiring substrate 1 of the first embodiment. In the third modified example of the second embodiment, like components/parts are denoted with like reference numerals as the reference numerals of the first and second embodiments and are not further explained.

Figure 20A:
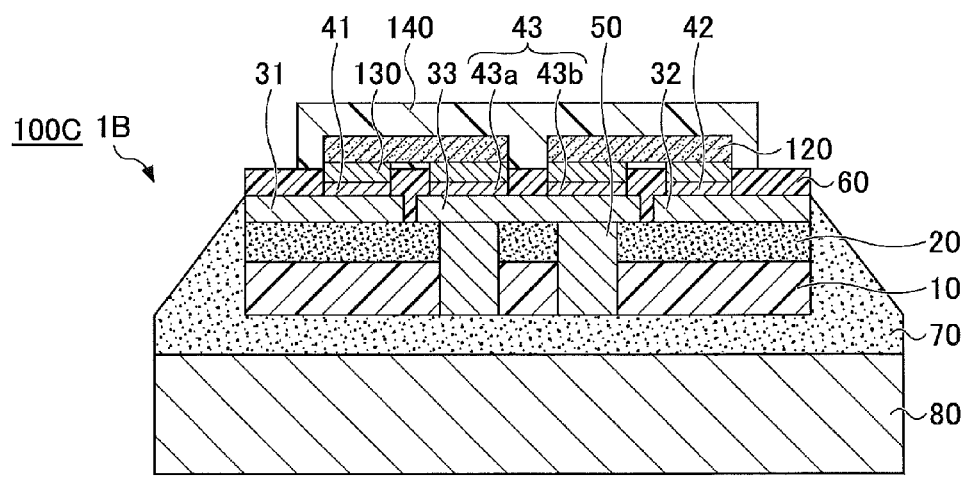
FIGS. 20A and 20B are schematic diagrams illustrating a semiconductor package according to a third modified example of the second embodiment.
Figure 20B:
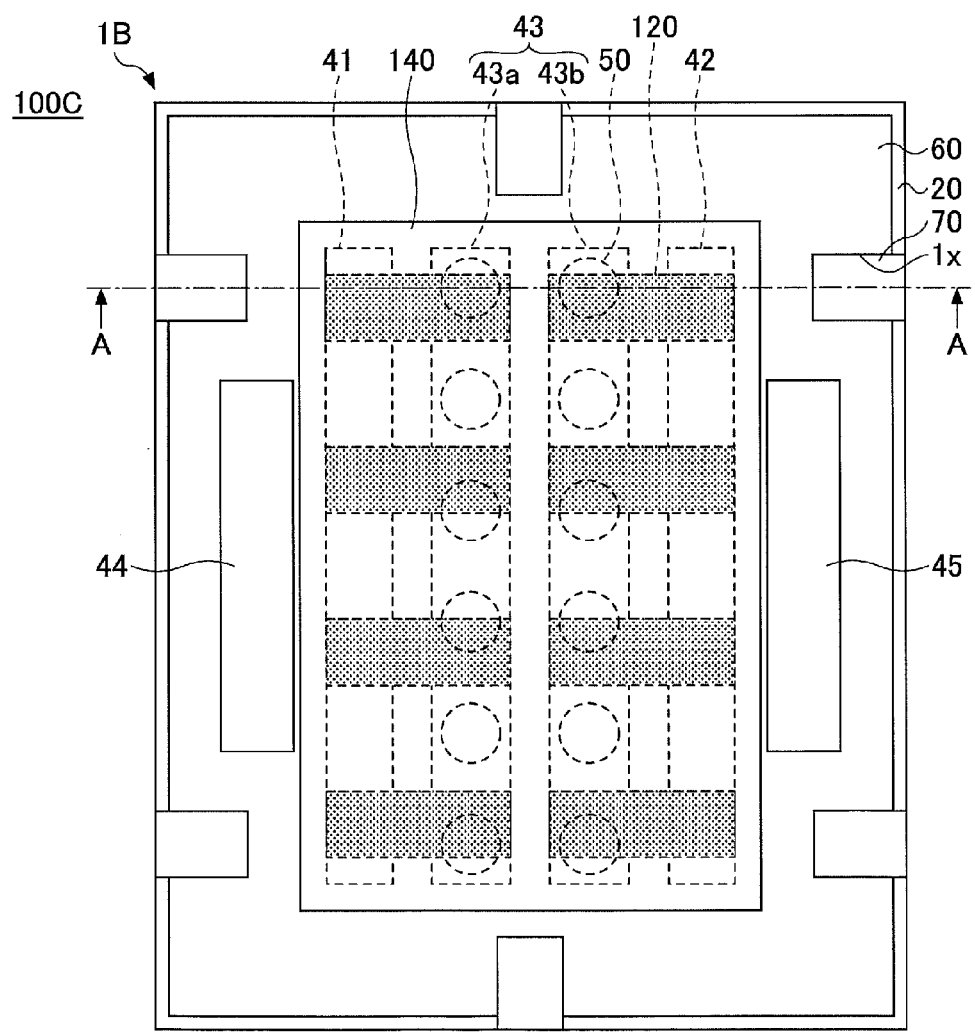

FIG. 20B is a plan view, and FIG. 20A is a cross-sectional view taken along the line A-A of FIG. 20B. For the sake of convenience, a semiconductor device 120 is illustrated with a matte pattern in FIG. 20B. With reference to FIGS. 20A and 20B, the semiconductor package 100C includes multiple semiconductor devices 120 mounted on the plating films 41, 43a, 42, and 43b of a wiring substrate 1B (see FIG. 14A). More specifically, the semiconductor devices 120 are flip-chip bonded, in a face-down state, onto the plating films 41, 43a, 42, and 43b interposed by the solder 130. Each of the semiconductor devices 120 is encapsulated by the encapsulating resin 140. Although eight semiconductor devices 120 are mounted on the wiring substrate 1B in the example of FIGS. 20A and 20B, the number of semiconductor devices 120 mounted on the wiring substrate 1B is arbitrary.

Four semiconductor devices 120 are arranged on the plating films 41 and 43a and connected in parallel. Further, four semiconductor devices 120 are arranged on the plating films 42 and 43b and connected in parallel. Further, the four semiconductor devices 120 arranged on the plating films 41 and 43a and the four semiconductor devices 120 arranged on the plating films 42 and 43b are connected in series. For example, an anode terminal of each of the semiconductor devices 120 arranged on the plating films 41 and 43a is connected to the plating film 41 whereas a cathode terminal of each of the semiconductor devices 120 arranged on the plating films 41 and 43a is connected to the plating film 43a. For example, an anode terminal of each of the semiconductor devices 120 arranged on the plating films 42 and 43b is connected to the plating film 43b whereas a cathode terminal of each of the semiconductor devices 120 arranged on the plating films 42 and 43b is connected to the plating film 42.

For example, the plating films 44 and 45 of the wiring substrate 1B are connected to a power source or a drive circuit that is provided outside of the semiconductor package 100C, so that a predetermined potential difference can be applied between the cathode terminal and the anode terminal of the semiconductor device 120. By applying the predetermined potential difference, the semiconductor device 120 is illuminated. The semiconductor device 120 generates heat when the semiconductor device 120 illuminates. The heat generated by the semiconductor device 120 is transmitted to the through-wiring 50 by way of the plating film 43 and the wiring 33, and is further transmitted to the heat radiation plate 80 by way of the adhesive layer 70. Thereby, the heat radiation plate 80 radiates the heat transmitted thereto. Because multiple through-wirings 50 are provided on the lower side of the heat radiation terminal of the semiconductor device 120, the heat generated by the semiconductor device 120 can be efficiently transmitted to the heat radiation plate 80.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the following processes may be performed instead of adhering the metal layer 30A to the substrate 10 interposed by the adhesive layer 20. First, a polyimide type resin film (e.g., a polyimide tape) is prepared as the substrate 10. Then, a metal layer (e.g., copper) may be directly formed on one surface of the substrate 10 without providing the adhesive layer 20. The metal layer may be formed by using, for example, an electroless plating method, a sputtering method, or an electroplating method. The metal layer formed on the substrate 10 can substitute for the metal layer 30A and function as the metal layer 30A. In this case, the through-hole 10x is formed only in the substrate 10 by using, for example, a laser process method. That is, the side of one surface of the through-hole 10x is covered by the metal layer formed on the substrate 10.

As other examples, the substrate 10 may be formed by applying an insulating resin (e.g., polyimide resin) on a metal foil (e.g., copper foil). In this case also, the through-hole 10x is formed only in the substrate 10 by using, for example, a laser process method. That is, the side of one surface of the through-hole 10x is covered by the metal layer formed on the substrate 10.

What is claimed is:

1. A wiring substrate comprising:
   a heat radiation plate;
   a substrate provided on the heat radiation plate interposed by an adhesive layer, the substrate including a first surface on which the adhesive layer is provided, and a second surface on an opposite side of the first surface;
   a wiring provided on the second surface of the substrate; and
   a notch part that penetrates the substrate in a thickness direction of the substrate, the notch part being formed by notching the substrate inward from an outer edge part of the substrate from a plan view,
   wherein the adhesive layer covers an end surface of the substrate that is exposed in an inner wall surface of the notch part.

2. The wiring substrate as claimed in claim 1,
   wherein an end surface of the wiring is exposed in the inner wall surface of the notch part,
   wherein the adhesive layer continuously covers the end surface of the substrate and the end surface of the wiring that are exposed in the inner wall surface of the notch part.

3. The wiring substrate as claimed in claim 2, wherein the adhesive layer further extends above the wiring.

4. The wiring substrate as claimed in claim 3, further comprising:
   a reflection film provided on the substrate to selectively expose the wiring,
   wherein the reflection film exposes an area of the substrate along the inner wall surface of the notch part from the plan view, and
   wherein the adhesive layer extends to the area of the substrate.

5. The wiring substrate as claimed in claim 3, further comprising:
   a reflection film provided on the substrate to selectively expose the wiring,
   wherein the reflection film is provided to fill the notch part.

6. The wiring substrate as claimed in claim 1, further comprising:
   an insulating film provided on an end surface of the wiring on a side of the inner wall surface of the notch part,
   wherein an end surface of the insulating film is exposed in the inner wall surface of the notch part.

7. The wiring substrate as claimed in claim 6, wherein the adhesive layer continuously covers the end surface of the substrate and the end surface of the insulating film that are exposed in the inner wall surface of the notch part.

8. The wiring substrate as claimed in claim 7, wherein the adhesive layer further extends above the wiring.

9. The wiring substrate as claimed in claim 8, further comprising:
   a reflection film provided on the substrate to selectively expose the wiring, wherein the reflection film exposes an area of the substrate along the inner wall surface of the notch part from the plan view, and wherein the adhesive layer extends to the area of the substrate.

10. The wiring substrate as claimed in claim 8, further comprising:

a reflection film provided on the substrate to selectively expose the wiring, wherein the reflection film is provided to fill the notch part.

11. The wiring substrate as claimed in claim 1, further comprising: a through-wiring that contacts a surface of the wiring on a side of the substrate and penetrates the substrate in the thickness direction of the substrate.

12. The wiring substrate as claimed in claim 11, further comprising: an insulating film provided on an end surface of the through-wiring on a side of the adhesive layer.

13. A semiconductor package comprising:

the wiring substrate of claim 1; and a semiconductor device or a module including a semiconductor device, wherein the semiconductor device or the module is mounted on the wiring substrate.

14. The wiring substrate as claimed in claim 1, wherein a bottom part of the notch part and an end surface of the wiring are flush from the plan view.

* * * * *